(12) United States Patent
Kim et al.

(10) Patent No.: US 9,767,920 B2
(45) Date of Patent: Sep. 19, 2017

(54) SEMICONDUCTOR MEMORY DEVICES AND MEMORY SYSTEMS INCLUDING THE SAME

(71) Applicants: Young-Il Kim, Suwon-si (KR); Hoi-ju Chung, Yongin-si (KR)

(72) Inventors: Young-Il Kim, Suwon-si (KR); Hoi-ju Chung, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 92 days.

(21) Appl. No.: 14/798,634

(22) Filed: Jul. 14, 2015

(65) Prior Publication Data

US 2016/0042809 A1    Feb. 11, 2016

(30) Foreign Application Priority Data

Aug. 11, 2014   (KR) .................. 10-2014-0103101

(51) Int. Cl.
| | |
|---|---|
| *G11C 29/00* | (2006.01) |
| *G11C 29/42* | (2006.01) |
| *G11C 29/44* | (2006.01) |
| *G11C 29/52* | (2006.01) |
| *G11C 11/401* | (2006.01) |
| *G11C 29/04* | (2006.01) |

(52) U.S. Cl.
CPC ............. *G11C 29/42* (2013.01); *G11C 29/44* (2013.01); *G11C 29/4401* (2013.01); *G11C 29/52* (2013.01); *G11C 11/401* (2013.01); *G11C 2029/0411* (2013.01)

(58) Field of Classification Search
None
See application file for complete search history.

(56) References Cited

U.S. PATENT DOCUMENTS

| | | |
|---|---|---|
| 7,159,069 B2 | 1/2007 | Adusumilli et al. |
| 7,373,583 B2 | 5/2008 | Hummler |
| 7,930,614 B2 | 4/2011 | Sato |
| 8,135,991 B2 | 3/2012 | Katano et al. |
| 2007/0255981 A1 | 11/2007 | Eto |
| 2009/0319840 A1 | 12/2009 | Hara et al. |

(Continued)

FOREIGN PATENT DOCUMENTS

JP    5344577 B2    11/2013

*Primary Examiner* — Daniel McMahon
(74) *Attorney, Agent, or Firm* — Harness, Dickey & Pierce, P.L.C.

(57) ABSTRACT

A semiconductor memory device includes a memory cell array, an input/output (I/O) gating circuit, an error decision circuit and an error check and correction (ECC) circuit. The I/O gating circuit reads test pattern data to provide test result data in a test mode and reads a codeword in a normal mode. The error decision circuit determines the correctability of errors in the test result data by a first unit, based on the test pattern data and the test result data and provides a first error kind signal indicating a first determination result, in the test mode. The ECC circuit decodes the codeword including main data and parity data generated based on the main data, determines correctability of errors in the codeword by a second unit and provides a second error kind signal indicating a second determination result, in the normal mode. The main data includes a plurality of unit data.

20 Claims, 22 Drawing Sheets

(56) References Cited

U.S. PATENT DOCUMENTS

| | | |
|---|---|---|
| 2010/0058144 A1 | 3/2010 | Rohleder et al. |
| 2013/0024747 A1* | 1/2013 | Sharon ................ G06F 11/1072 714/773 |
| 2013/0055045 A1 | 2/2013 | Myung et al. |
| 2013/0073926 A1* | 3/2013 | Nemazie .............. G11C 29/808 714/773 |
| 2013/0198587 A1* | 8/2013 | Kim .................... G06F 11/1048 714/763 |
| 2014/0298090 A1* | 10/2014 | Larsen .................. G06F 11/108 714/6.24 |
| 2015/0143198 A1* | 5/2015 | Chun .................. G06F 11/1072 714/768 |
| 2015/0162099 A1* | 6/2015 | Jeong ..................... G11C 29/42 714/719 |
| 2015/0248329 A1* | 9/2015 | Kang ................ G11C 11/40611 714/764 |
| 2016/0155515 A1* | 6/2016 | Son ........................ G11C 29/42 714/719 |

* cited by examiner

SEMICONDUCTOR MEMORY DEVICES AND MEMORY SYSTEMS INCLUDING THE SAME

CROSS-REFERENCE TO RELATED APPLICATION(S)

This U.S. non-provisional application claims the benefit of priority under 35 USC §119 to Korean Patent Application No. 10-2014-0103101, filed on Aug. 11, 2014, in the Korean Intellectual Property Office, the contents of which are incorporated herein in its entirety by reference.

BACKGROUND

1. Technical Field

Example embodiments relate to memory devices, and more particularly to semiconductor memory devices and memory systems including the same.

2. Discussion of the Related Art

Semiconductor memory devices may be classified as non-volatile memory devices, such as flash memory devices, and volatile memory devices, such as Dynamic Random Access Memory devices (DRAMs). DRAMs are inexpensive and are used for storing mass data such as system memories. As the semiconductor fabrication process for volatile memory devices, such as DRAMs, continues to improve, thereby reducing the physical size of DRAMs, the bit error rate (BER) of memory cells in the DRAMs may rapidly increase.

SUMMARY

Some example embodiments may provide a semiconductor memory device capable of enhancing performance.

Some example embodiments may provide a memory system including a semiconductor memory device capable of enhancing performance.

According to some example embodiments, a semiconductor memory device may include a memory cell array, an input/output (I/O) gating circuit, an error decision circuit and an error check and correction (ECC) circuit. The I/O gating circuit may read test pattern data from the memory cell array to provide test result data in a test mode, and may read a codeword from the memory cell array in a normal mode. The error decision circuit may determine correctability of errors in the test result data according to a first unit whose size may be equal to or smaller than a size of the codeword, based on the test pattern data and the test result data, and the error decision circuit may provide a first error kind signal indicating a first determination result, in the test mode. The ECC circuit may decode the codeword, the codeword including main data and parity data generated from the main data. The ECC circuit may determine correctability of errors in the codeword according to a second unit whose size is equal to or smaller than the size of the codeword, and may provide a second error kind signal indicating a second determination result, in the normal mode. The main data may include a plurality of unit data.

In some example embodiments, the error decision circuit may be configured to be enabled in response to a mode signal indicating the test mode.

In some example embodiments, the error decision circuit may include a first buffer that may store the test pattern data, a second buffer that may store the test result data, a comparator circuit that may be configured to compare corresponding bits of the data pattern data and the test result data, and to output comparison result data, and an error counter block that may be configured to provide the first error kind signal based on the comparison result data.

In some example embodiments, the comparator circuits may include a plurality of comparators wherein each of the plurality of comparators may be configured to compare a corresponding bit of the data pattern data and the test result data and may be configured to output each bit of the comparison result data. The error counter block may include a plurality of error counters, where each error counter block may be configured to count a number of errors based on the comparison result data and a logic unit that may be configured to provide the first error kind signal based on outputs of the plurality of error counters.

The logic unit may include an OR gate that may receive the outputs of the error counters and an AND gate that may receive an output of the OR gate and a test mode register set signal, and the logic unit may be configured to output the first error kind signal.

The logic unit may also include a first AND gate that may receive the outputs of the error counters and a second AND gate that may receive an output of the first AND gate and a test mode register set signal, and the logic unit may be configured to output the first error kind signal.

The error decision circuit may be configured to output the first error kind signal with a first logic level when the number of errors in the test result data is zero or within an error correction capability of the ECC circuit.

The error decision circuit may be configured to output the first error kind signal with a second logic level when a number of errors in the test result data exceed an error correction capability of the ECC circuit.

The error decision circuit may be configured to output the first error kind signal with a second logic level when a number of errors in the test result data are not zero.

In some example embodiments, the ECC circuit may include an encoder that may be configured to receive the main data to generate the parity data, and may provide the codeword to the I/O gating circuit, and a decoder that may be configured to receive the codeword from the I/O gating circuit and may detect the errors in the main data using the parity data.

The decoder may include a syndrome generator that may be configured to generate syndromes based on the main data and the parity data, an error position detector that may be configured to detect a position of the error in the main data based on the syndromes, an error corrector that may be configured to correct the error in the main data based on the position of the error to provide a corrected main data, and an error signal generator that may be configured to generate the second error kind signal based on the position of the error.

In some example embodiments, the semiconductor memory device may further include a register unit. The register unit may be configured to store the first error kind signal and a first fail address associated with the first error kind signal while in the test mode. The register unit may also be configured to store the second error kind signal and a second fail address associated with the second error kind signal while in the normal mode.

The register unit may include a register that may be configured to store the first error kind signal and the second error kind signal, and may also include a fail address table that may be configured to store the first fail address and the second fail address.

The register unit may also be configured to provide the first error kind signal and the first fail address to an external device as an error information signal while in the test mode.

When the size of the first unit is smaller than the size of the codeword, the error information signal may include a plurality of partial error information signals, each indicating an error correctability of the first unit smaller than the size of the codeword.

The register unit may also be configured to provide the second error kind signal and the second fail address to an external device as an error information signal while in the normal mode. When the size of the second unit is smaller than the size of the codeword, the error information signal may include a plurality of partial error information signals, each indicating an error correctability of the first unit smaller than the size of the codeword.

The semiconductor memory device may be configured to provide the error information signal to the external device through a data pin.

The semiconductor memory device may be configured to provide the error information signal to the external device through an extra pin.

According to some example embodiments, a memory system may include a semiconductor memory device and a memory controller to control the semiconductor memory device. The semiconductor memory device may include a memory cell array, an input/output (I/O) gating circuit, an error check and correction (ECC) circuit and a register unit. The memory cell array may include a normal cell array and a redundancy cell array. The I/O gating circuit may be configured to write a codeword in the memory cell array and reads the codeword from the memory cell array. The ECC circuit may be configured to encode main data, where the main data may include a plurality of unit data to generate parity data. The ECC circuit may be configured to provide the codeword, including the main data and the parity data, to the I/O gating circuit, and the ECC circuit may also be configured to decode the codeword to determine the correctability of errors in the codeword by a unit whose size is equal to or smaller than the size of the codeword to provide an error kind signal indicating the determination result, in a normal mode. The register unit may be configured to store the error kind signal and a fail address associate with the error kind signal, and may also be configured to provide the error kind signal and the fail address to the memory controller as an error information signal.

In some example embodiments, the memory controller may be configured to determine an error repair policy that handles the errors in the codeword based on the error information signal.

The memory controller may be configured to determine the error repair policy such that the errors are handled by the unit whose size is equal to or smaller than the size of the codeword. When the errors are handled by the unit whose size is equal to or smaller than the size of the codeword, a size of the unit by which the errors is handled may be greater than or equal to the size of the unit data.

When the unit by which the errors are handled includes errors exceeding the error correction capability of the ECC circuit, the memory controller may be configured to control the semiconductor memory device such that the semiconductor memory device handles the errors using the redundancy cell array.

When the unit by which the errors are handled includes errors within the error correction capability of the ECC circuit, the memory controller may be configured to control the semiconductor memory device such that the semiconductor memory device handles the errors using the ECC circuit.

According to some example embodiments, a memory system may include a semiconductor memory device and a test device. The test device may be configured to test the semiconductor memory device. The semiconductor memory device may include a memory cell array, an input/output (I/O) gating circuit, an error decision circuit, an error check and correction (ECC) circuit and a register unit. The memory cell array may include a normal cell array and a redundancy cell array. The I/O gating circuit may be configured to read test pattern data from the memory cell array and may be configured to provide test result data in a test mode. The I/O gating circuit may be configured to read a codeword from the memory cell array in a normal mode. The error decision circuit may be configured to determine the correctability of errors in the test result data by a unit whose size is equal to or smaller than the size of the codeword, based on the test pattern data and the test result data, and may provide an error kind signal indicating the determination result, in the test mode. The ECC circuit may be configured to decode the codeword that includes the main data, the main data may be configured to have a plurality of unit data and parity data, while in the normal mode. The register unit may be configured to store the error kind signal and a fail address associated with the error kind signal and may be configured to provide the error kind signal and the fail address to the test device as an error information signal while in the test mode.

In some example embodiments, the test device may be configured to determine the error kind by the unit based on the error information signal. The size of the unit may be greater than or equal to a size of the unit data. When a number of the errors in the unit exceeds an error correction capability of the ECC circuit, the test device may be configured to control the semiconductor memory device so that the semiconductor memory device may handle the errors using a redundancy area not including errors of the redundancy cell array, or using a redundancy area including the correctable errors of the redundancy cell array.

In some example embodiments, the test device may be configured to determine the error kind by the unit based on the error information signal. The size of the unit may be greater than or equal to a size of the unit data. When the number of the errors in the unit is within the error correction capability of the ECC circuit, the test device may be configured to control the semiconductor memory device such that the semiconductor memory device handles the errors using a redundancy area not including errors of the redundancy cell array.

Accordingly, in the semiconductor memory devices, the test device or the memory controller may utilizes the number of, and positions of, the correctable errors as information for error monitoring, quality level and test solution. In addition, the test device or the memory controller sets a size of error repair unit that is smaller than the size of the codeword to utilize redundancy resources efficiently.

According to some example embodiments, a system for error checking semiconductor memory may include an I/O gating circuit configured to write test pattern data into a memory array and may be configured to read the test pattern data from the memory array as test result data. The system may also include an error decision circuit configured to determine whether a memory error occurred based on the test result data and the test pattern data and may be configured to generate an error type signal based on results of the determining, the error type signal indicating a type of error, and a register unit may be configured to generate an error information signal based on the error type signal.

Additionally, the register unit may be configured to generate the error information signal based on the error type signal and a memory address associated with the error type signal.

The system may also include a test device which may be configured to receive the error information signal and may determine an error repair policy based on the error information signal. The system may also include an error check and correction circuit (ECC) which may be configured to determine the presence of errors in the data read from the memory array, and may also be configured to generate a second error type signal based on results of the determining. The register unit may also be configured to generate the error information signal based on the second error type signal and a memory address associated with the second error type signal.

Additionally, the system may also include a memory controller which may be configured to receive the error information signal and may determine an error repair policy based on the error information signal.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EXAMPLE EMBODIMENTS

Figure 1:
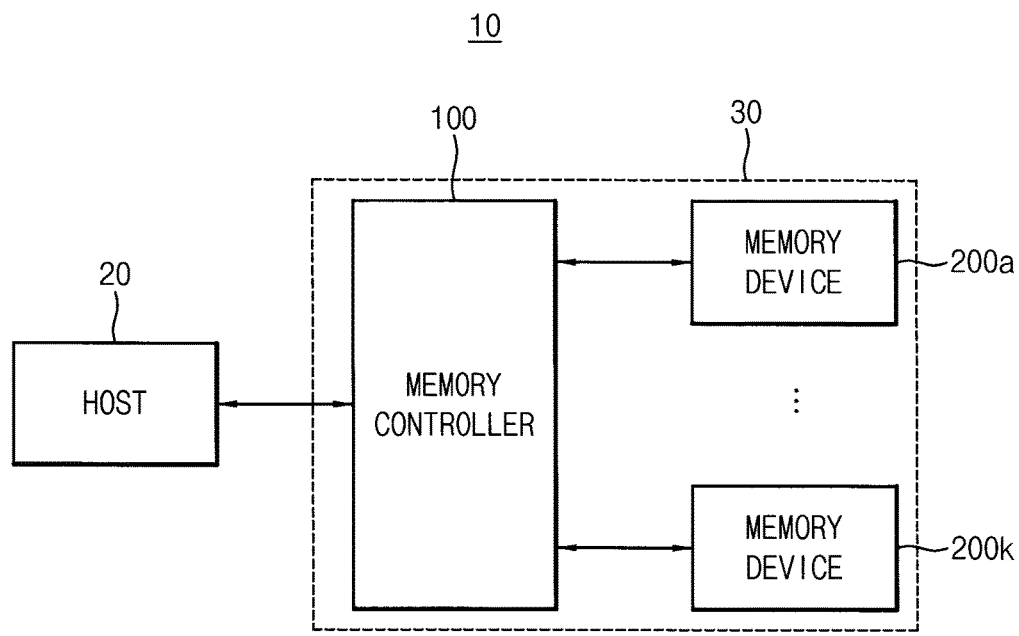
FIG. 1 is a block diagram illustrating an electronic system according to some example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. These example embodiments are just that—examples—and many implementations and variations are possible that do not require the details provided herein. It should also be emphasized that the present disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the present disclosure. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). Expressions such as "at least one of," when preceding a list of elements, modify the entire list of elements and do not modify the individual elements of the list.

The terminology used herein is for the purpose of describing particular example embodiments only and is not intended to be limiting of the example embodiments of the present disclosure. As used herein, the singular forms "a," "an" and "the" are intended to include the plural forms as well, unless the context clearly indicates otherwise. It will be further understood that the terms "comprises" and/or "comprising," when used in this disclosure, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments of the present disclosure belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Meanwhile, when example embodiments can be implemented differently, functions or operations of certain example embodiments may occur in a different way from a flow described in the flowchart according to the present example embodiments. For example, two consecutive operations or functions may be performed simultaneously, or some operations or functions may be performed in a reverse order.

Hereinafter, some example embodiments of the inventive concepts will be described in detail with reference to the accompanying drawings.

FIG. 1 is a block diagram illustrating an electronic system according to some example embodiments.

Referring to FIG. 1, an electronic system 10 may include a host 20 and a memory system 30. The memory system 30 may include a memory controller 100 and a plurality of semiconductor memory devices 200a~200k.

The host 20 may communicate with the memory system 30 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 20 may also communicate with the memory system 30 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 30. The memory controller 100 may control an overall data exchange between the host 20 and the plurality of semiconductor memory devices 200a~200k. For example, the memory controller 100 may write data in the plurality of semiconductor memory devices 200a~200k or read data from the plurality of semiconductor memory devices 200a~200k in response to request from the host 20.

In addition, the memory controller 100 may issue operation commands to the plurality of semiconductor memory devices 200a~200k for controlling the plurality of semiconductor memory devices 200a~200k.

In some embodiments, each of the plurality of semiconductor memory devices 200a~200k may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc. In some embodiments, each of the plurality of semiconductor memory devices 200a~200k may be a nonvolatile memory device such as a flash memory or a resistive memory device.

Figure 2:
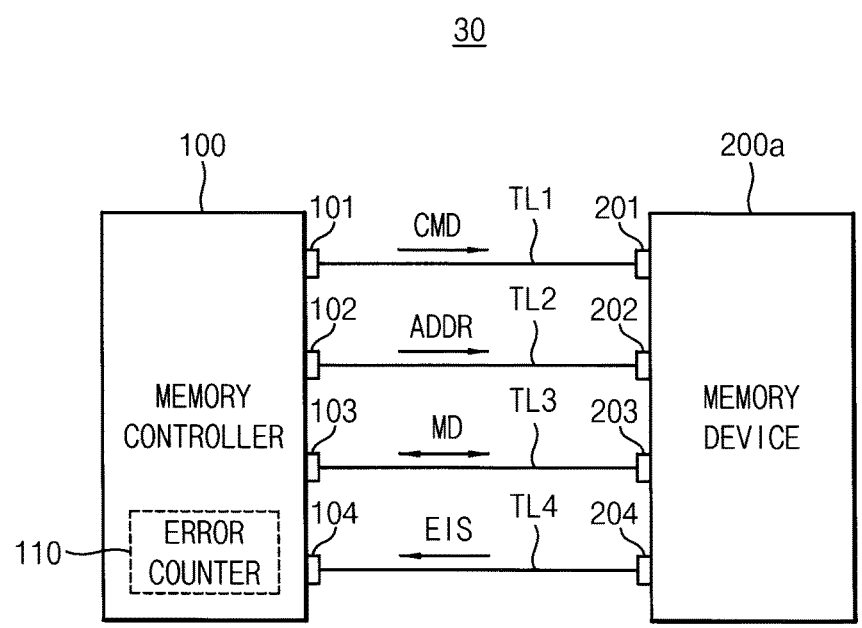
FIG. 2 is a block diagram illustrating an example of the memory system in FIG. 1 according to some example embodiments.

FIG. 2 is a block diagram illustrating an example of the memory system in FIG. 1 according to some example embodiments.

In FIG. 2, only one semiconductor memory device 200a in communication with the memory controller 100 is illustrated for convenience. However, the details discussed herein related to semiconductor memory device 200a may equally apply to the other semiconductor memory devices 200b~200k.

Referring to FIG. 2, the memory system 30 may include the memory controller 100 and the semiconductor memory device 200a. Each of the memory controller 100 and the semiconductor memory device 200a may be formed as a separate semiconductor chip or as a separate group of chips (e.g., semiconductor memory device 200a may comprise a stack of semiconductor chips in a semiconductor package). The memory controller 100 and the semiconductor memory device 200a may be connected to each other through corresponding command pins 101 and 201, corresponding address pins 102 and 202, corresponding data pins 103 and 203 and corresponding separate pins 104 and 204. The command pins 101 and 201 may transmit a command signal CMD through a command transmission line TL1, the address pins 102 and 202 may transmit an address signal ADDR through an address transmission line TL2, and the data pins 103 and 203 may exchange main data MD including a plurality of unit data through a data transmission line TL3. The separate pins 104 and 204 may transmit an error information signal EIS through a separate transmission line TL4.

Referring to FIGS. 1 and 2, the memory controller 100 may input main data to the semiconductor memory device 200a or may output main data from the semiconductor memory device 200a through the data pins 103 and 203 based on the request from the host 20. In addition, the semiconductor memory device 200a may receive an address from the memory controller 100 through the address pins 102 and 202. The memory controller 100 may include an error counter 110.

Figure 3:
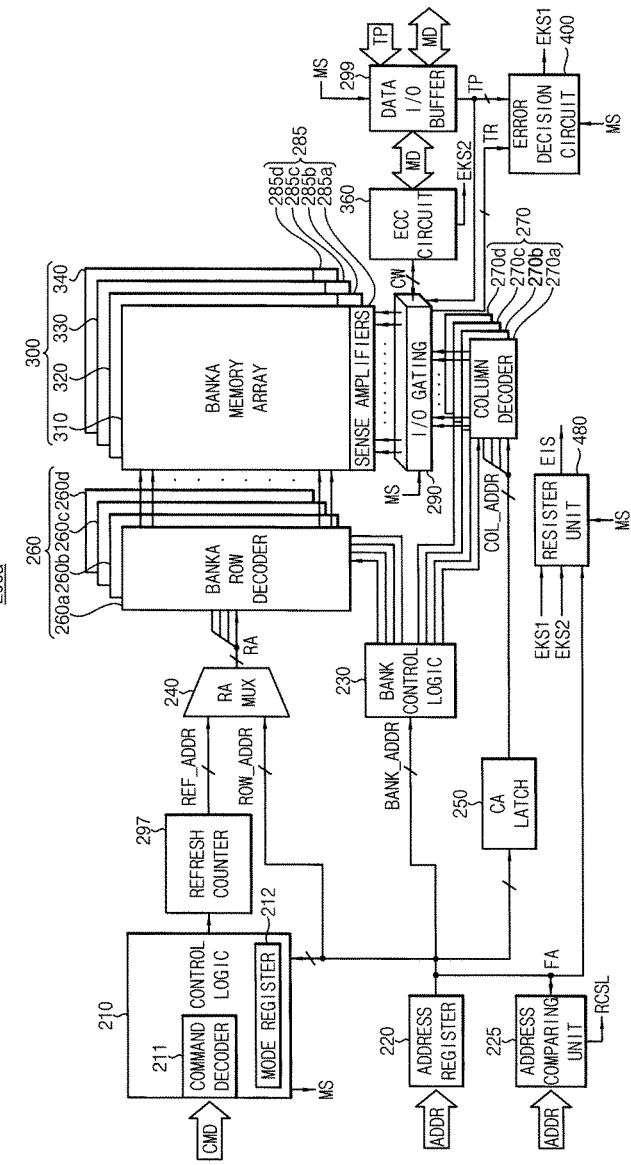
FIG. 3 is a block diagram illustrating an example of the semiconductor memory device in FIG. 2 according to some example embodiments.

FIG. 3 is a block diagram illustrating the semiconductor memory device in FIG. 2 according to some example embodiments.

Referring to FIG. 3, the semiconductor memory device 200a may include a control logic 210, an address register 220, an address comparing unit 225, a bank control logic 230, a refresh counter 297, a row address multiplexer 240, a column address latch 250, a row decoder 260, a column decoder 270, a memory cell array 300, a sense amplifier unit 285, an input/output (I/O) gating circuit 290, an error check and correction (ECC) circuit 360, a data input/output (I/O) buffer 299, an error decision circuit 400 and a register unit 480.

The memory cell array 300 may include first through fourth bank arrays 310~340. The row decoder 260 may include first through fourth bank row decoders 260a~260d respectively coupled to the first through fourth bank arrays 310~340, the column decoder 270 may include first through fourth bank column decoders 270a~270d respectively coupled to the first through fourth bank arrays 310~340, and the sense amplifier unit 285 may include first through fourth bank sense amplifiers 285a~280d respectively coupled to the first through fourth bank arrays 310~340. The first through fourth bank arrays 310~340, the first through fourth bank row decoders 260a~260d, the first through fourth bank column decoders 270a~270d and first through fourth bank sense amplifiers 285a~280d may form the first through fourth banks Although the semiconductor memory device 200a is illustrated in FIG. 3 as including four banks, the semiconductor memory device 200a may include any number of banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a~260d corresponding to the bank address BANK_ADDR may be activated in response to the bank control signals, and one of the first through fourth bank column decoders 270a~270d corresponding to the bank address BANK_ADDR may be activated in response to the bank control signals.

The refresh counter 297 may generate a refresh row address REF_ADDR for refreshing memory cell rows in the memory cell array in response to a refresh command REF from the control logic 210. The refresh row address REF_ADDR may be an abbreviated refresh row address obtained by omitting some bits from a plurality of bits designating one memory cell row.

The row address multiplexer 240 may receive the row address ROW_ADDR from the address register 220, and may receive the refresh row address REF_ADDR from the refresh counter 297. The row address multiplexer 240 may selectively output the row address ROW_ADDR or the refresh row address REF_ADDR as a row address RA. The row address RA that is output from the row address multiplexer 240 may be applied to the first through fourth bank row decoders 260a~260d.

The activated one of the first through fourth bank row decoders 260a~260d may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through fourth bank column decoders 270a~270d.

The activated one of the first through fourth bank column decoders 270a~270d may decode the column address COL_ADDR that is output from the column address latch 250, and may control the I/O gating circuit 290 in order to output data corresponding to the column address COL_ADDR.

The I/O gating circuit 290 may include circuitry for gating input/output data. The I/O gating circuit 290 may further include read data latches for storing data that is output from the first through fourth bank arrays 310~340, and write drivers for writing data to the first through fourth bank arrays 310~340.

Codeword CW may be read from one bank array of the first through fourth bank arrays 310~340 and may be sensed by a sense amplifier coupled to the one bank array from which the data is to be read, and may be stored in the read data latches. The codeword CW stored in the read data latches may be provided to the memory controller 100 via the ECC circuit 360 and the data I/O buffer 299. The main data MD to be written in one bank array of the first through fourth bank arrays 310~340 may be provided to the data I/O buffer 299 from the memory controller 100. The main data MD provided to the data I/O buffer 299 is encoded to the codeword CW in the ECC circuit 360. The write driver may write the codeword CW in one bank array of the first through fourth bank arrays 310~340.

The data I/O buffer 299 may receive test pattern data TP from an external test device in a test mode, and may provide the test pattern data TP to the I/O gating circuit 290 and the error decision circuit 400. The I/O gating circuit 290 may write the test pattern data TP to a target page of the memory cell array 300 and may read the test pattern data TP from the target page in order to provide test result data TR to the error decision circuit 400 when it is in a test mode.

The error decision circuit 400 may store the test pattern data TP, receive the test result data TR, and compare corresponding bits of the test pattern data TP and the test result data TR. The error decision circuit 400 may then determine the correctability of the errors in the test result data TR by a first unit whose size is smaller than or equal to a size of the codeword CW, and may provide the register unit 480 with a first error kind signal EKS1 that indicates the determination result, or in other words, the first error kind signal may provide a signal indicating the error type detected by the error decision circuit.

When the error decision circuit 400 determines the correctability of errors in the test result data TR by the first unit whose size is equal to the size of the codeword CW, in other words when the size of the first unit is equal to the size of the codeword, the first error kind signal EKS1 may indicate the error kind, or error type. Examples of possible error kind, or error type, codes include, but are not limited to, the "no error" (NE) code, which means that the number of errors in the test result data TR was zero, the "correctable error" (CE) code, which means that the number of errors in the test result data TR was within the error correction capability of the ECC circuit 360, or the "uncorrectable error" (UE) code, which means that the number of errors in the test result data TR exceeded the error correction capability of the ECC circuit 360. As an example, when the first error kind signal EKS1 is two bits, '00' may correspond to the NE error kind code, '01' may correspond to the CE error kind code, and '11' may correspond to the UE error kind code.

When the error decision circuit 400 determines the correctability of errors in the test result data TR by the first unit whose size is smaller the size of the codeword CW, in other words when the size of the first unit is smaller the size of the codeword, the first error kind signal EKS1 may also include, but is not limited to the "partial no error" (pNE) code, which means that the number of errors in the first unit is zero, the partial correctable error (pCE) code, which means that the number of errors in the first unit is within the error correction capability of the ECC circuit 360, or the partial uncorrectable error (pUE) code, which means that the number of errors in the first unit exceeds the error correction capability of the ECC circuit 360.

The ECC circuit 360 may generate parity data based on the main data MD, the main data MD including a plurality of unit data from the data I/O buffer 299 in a write operation, and provides the I/O gating circuit 290 with the codeword CW which includes the main data MD and the parity data. The I/O gating circuit 290 writes the codeword CW to the target page of the memory cell array 300. In addition, in a read operation, the ECC circuit 360 receives the codeword CW which is read from the target page from the I/O gating circuit 290. The ECC circuit 360 decodes the main data MD using the parity data in the codeword CW, determines a correctability of errors in the main data MD by a second unit whose size is smaller than or equal to the size of the codeword CW and provides the register unit 480 with a second error kind signal EKS2 indicating the determination result. The second error kind signal EKS2 may be one of the NE, the CE and the UE or may be one of the pNE, the pCE and the pUE according to the size of the second unit.

The register unit 480 may store the first error kind signal EKS1 and a fail address FA associated with the first error kind signal EKS1 in the test mode and may store the second error kind signal EKS2 and a fail address FA associated with the second error kind signal EKS2 in the normal mode. The register unit 480 may provide an external memory controller with the first error kind signal EKS1 and the fail address FA associated with the first error kind signal EKS1 as an error information signal EIS in the test mode, and may provide the external memory controller with the second error kind signal EKS2 and the fail address FA associated with the second error kind signal EKS2 as the error information signal EIS in the normal mode.

The address comparing unit 225 may store the fail address FA and may enable a redundancy column selection signal RCSL for activate a redundancy array when the address signal ADDR matches the fail address FA.

The control logic 210 may control operations of the semiconductor memory device 200a. For example, the control logic 210 may generate control signals for the semiconductor memory device 200a in order to perform a write operation or a read operation. The control logic 210 may include a command decoder 211 that decodes a command CMD received from the memory controller 100 and a mode register 212 that sets an operation mode of the semiconductor memory device 200a.

For example, the command decoder 211 may generate the control signals corresponding to the command CMD by decoding a write enable signal (/WE), a row address strobe signal (/RAS), a column address strobe signal (/CAS), a chip select signal (/CS), etc. The command decoder 211 may generate a mode signal MS directing an operation mode of the semiconductor memory device 200a by decoding the command CMD. The control logic 210 may provide the mode signal MS to the data I/O buffer 299, the error decision circuit 400, the I/O gating circuit 290 and the register unit 480.

Figure 4:
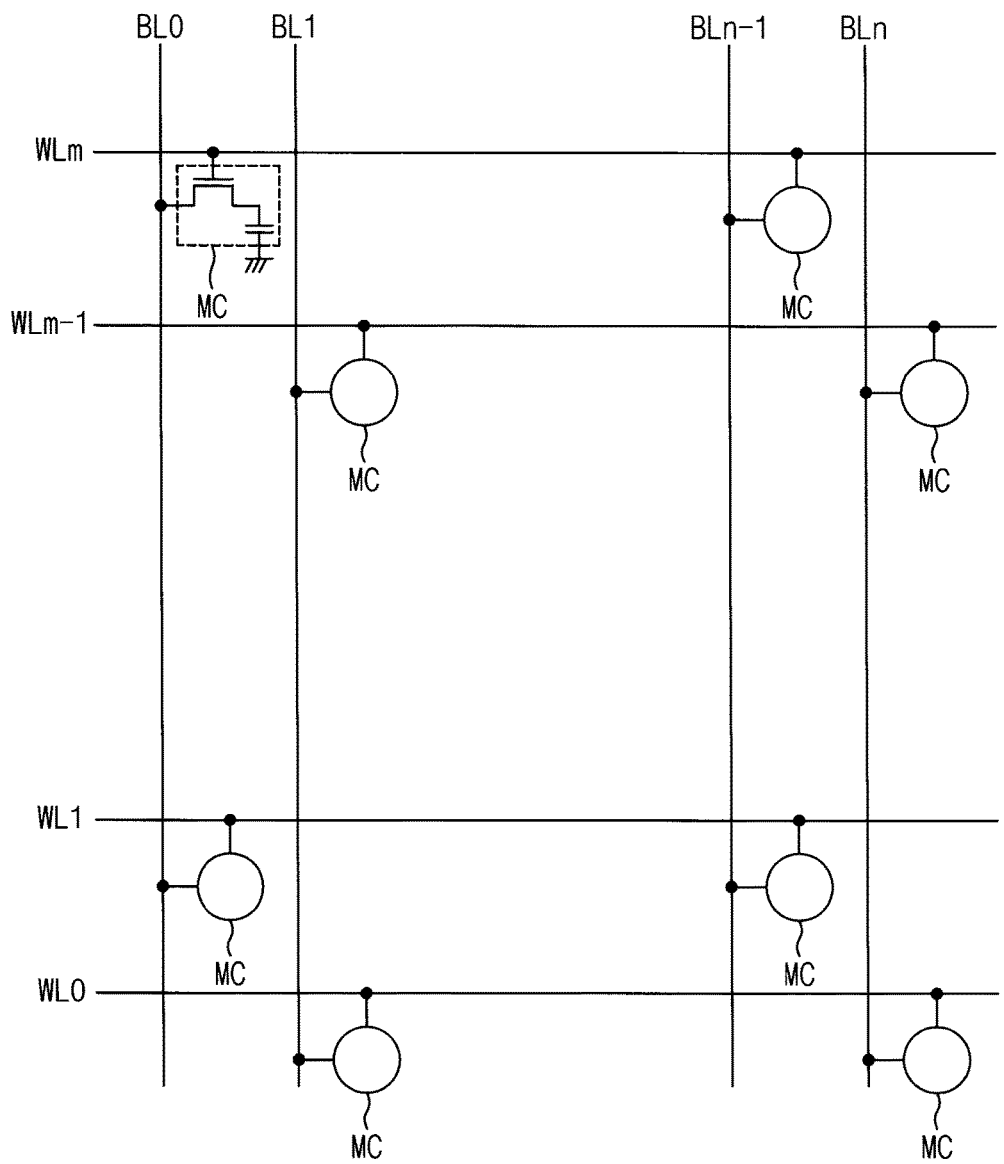
FIG. 4 is a block diagram illustrating an example of one bank array in the semiconductor memory device of FIG. 3 according to some example embodiments.

FIG. 4 is a block diagram illustrating an example of one bank array in the semiconductor memory device of FIG. 3 according to some example embodiments.

Referring to FIG. 4, each of the bank arrays 310~340 may include a plurality of memory cells that are arranged in columns and rows. Each of the bank arrays 310~340 may include a plurality of word-lines WL0~WLm (m is natural number greater than 2), a plurality of bit-lines BL0~BLn (n is a natural number greater than 2), and a plurality of memory cells MCs disposed near intersections between the word-lines WL0~WLm and the bit-lines BL0~BLn. 5. In one embodiment, each of the plurality of memory cells MCs may include a dynamic random access memory (DRAM) cell structure.

Figure 5:
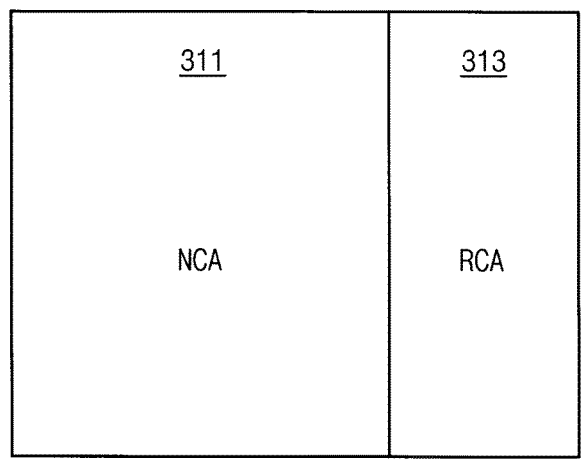
FIG. 5 is a block diagram illustrating the first bank array in the semiconductor memory device of FIG. 3 according to some example embodiments.

FIG. 5 is a block diagram illustrating the first bank array in the semiconductor memory device of FIG. 3 according to some example embodiments.

Referring to FIG. 5, the first bank array 310 may include a normal cell array 311 and a redundancy cell array 313. The normal cell array 311 may include a plurality of normal cells in which the main data MD and the parity data are stored and the redundancy cell array 313 may include a plurality of redundancy cells for repairing defective cells in the normal cell array 311.

Figure 6:
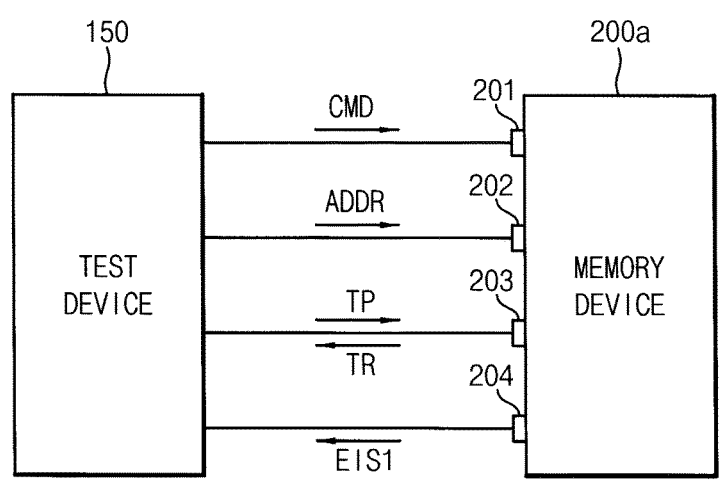
FIG. 6 is a block diagram illustrating a memory system according to some example embodiments.

FIG. 6 is a block diagram illustrating a memory system according to some example embodiments.

Referring to FIG. 6, a memory system 40 may include a test device 150 and the semiconductor memory device 200a of FIG. 3.

The test device 150 may apply a command CMD indicating the test mode to the semiconductor memory device 200a through the command pin 201, may apply a target address ADDR to the semiconductor memory device 200a through the address pin 201, may apply the test pattern data TP to the semiconductor memory device 200a through the data pin 203, may receive the test result data TR from the semiconductor memory device 200a through the data pin 203 and may receive the first error information signal EIS1 from the semiconductor memory device 200a through the extra pin 204 in the test mode. As mentioned above, the first error information signal EIS1 may include the first error kind signal EKS1 and the fail address FA associated with the first error kind signal EKS1. The test device 150 may determine the kind of the errors in the test result data TR by the second unit whose size is smaller than or equal to the size of the codeword based on the first error information signal EIS1. When the test device 150 may determine the kind of the errors by the second unit whose size is smaller than the size of the codeword, the size of the second unit is equal to or greater than the size of the unit data.

Figure 7:
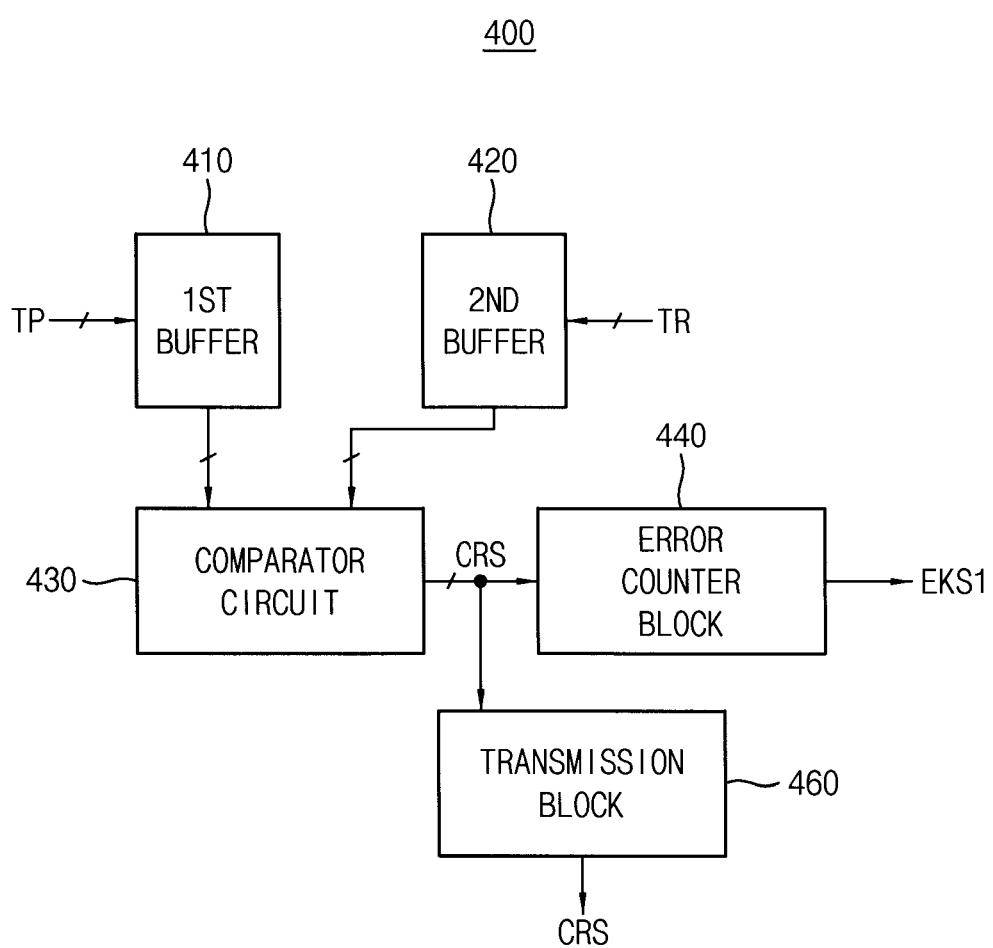
FIG. 7 is a block diagram illustrating the error decision circuit in the semiconductor memory device of FIG. 3 according to some example embodiments.

FIG. 7 is a block diagram illustrating the error decision circuit in the semiconductor memory device of FIG. 3 according to some example embodiments.

Referring to FIG. 7, the error decision circuit 400 may include a first buffer 410, a second buffer 420, a comparator circuit 430, an error counter block 440 and a transmission block 460.

The first buffer 410 stores the test pattern data TP from the data I/O buffer 299 in the test mode. The I/O gating circuit 290 writes the test pattern data TP to the target page of the memory cell array 300. The second buffer 420 stores the test result data TR read from the target page of the memory cell array 300. The comparator circuit 430 is coupled to the first buffer 410 and the second buffer 420, compares corresponding bits of the test pattern data TP and the test result data TR and outputs comparison result data CRS indicating the comparison result. The comparator circuit 430 may provide the comparison result data CRS to the error counter block 440 and the transmission block 460. The transmission block 460 may transmit the comparison result data CRS to an external test device. The error counter block 440 may provide the register unit 480 with the first error kind signal EKS1 indicating a correctability of the errors in the test result data TR based on the comparison result data CRS.

When the error decision circuit 400 determines a correctability of errors in the test result data TR by the first unit whose size is equal to the size of the codeword CW, that is when the size of the first unit is equal to the size of the codeword, the first error kind signal EKS1 may be one of no error (NE) which means a number of errors in the test result data TR is zero, correctable error (CE) which means a number of errors in the test result data TR is within an error correction capability of the ECC circuit 360 and uncorrectable error (UE) which means a number of errors in the test result data TR exceeds the error correction capability of the ECC circuit 360. When the first error kind signal EKS1 includes two bits, '00' may correspond to the NE, '01' may correspond to the CE and '11' may correspond to the UE.

When the error decision circuit 400 determines the correctability of errors in the test result data TR by the first unit whose size is smaller the size of the codeword CW, that is when the size of the first unit is smaller the size of the codeword, the first error kind signal EKS1 may be one of partial no error (pNE) which means a number of errors in the first unit is zero, partial correctable error (pCE) which means a number of errors in the first unit is within the error correction capability of the ECC circuit 360 and partial uncorrectable error (pUE) which means a number of errors in the first unit exceeds the error correction capability of the ECC circuit 360.

Figure 8:
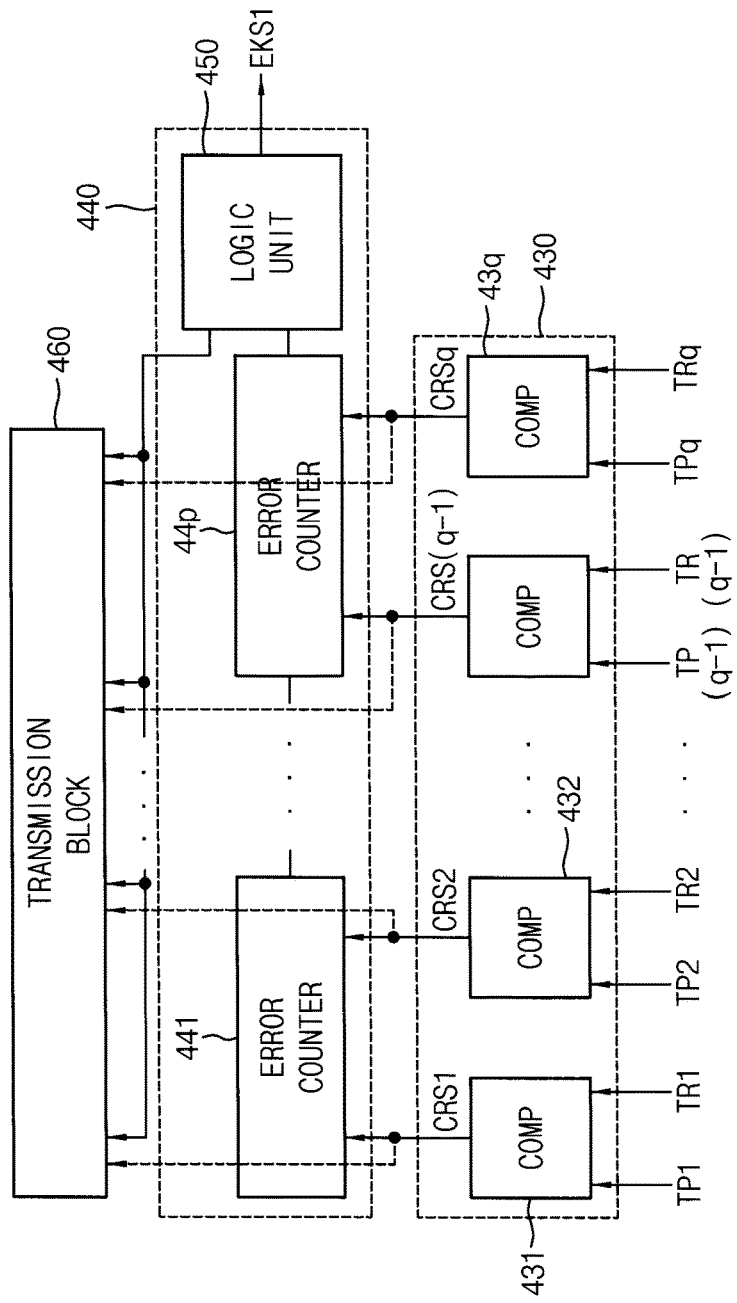
FIG. 8 illustrates portions of the error decision circuit in FIG. 7 according to some example embodiments.

FIG. 8 illustrates portions of the error decision circuit in FIG. 7 according to some example embodiments.

Referring to FIGS. 7 and 8, the comparator circuit 430 may include a plurality of comparators 431~43$q$ (q is a natural number greater than 3), and each of the comparators 431~43$q$ compares each of corresponding bits TP1 and TR1~TPq and TRq of the test pattern data TP and the test result data TR to output corresponding bit of the comparison result data CRS1~CRSq. The error counter block 450 includes a plurality of error counters 441~44$p$ (p is a natural number greater than 1) and a logic unit 450. Each of the error counters 441~44$p$ receives two bits of the comparison result data CRS and counts a number of errors in the two bits. The logic unit 450 outputs the first error kind signal EKS1 based on the outputs of the error counters 441~44$p$. The transmission block 460 may transmits the comparison result data CRS to the external test device.

Figure 9:
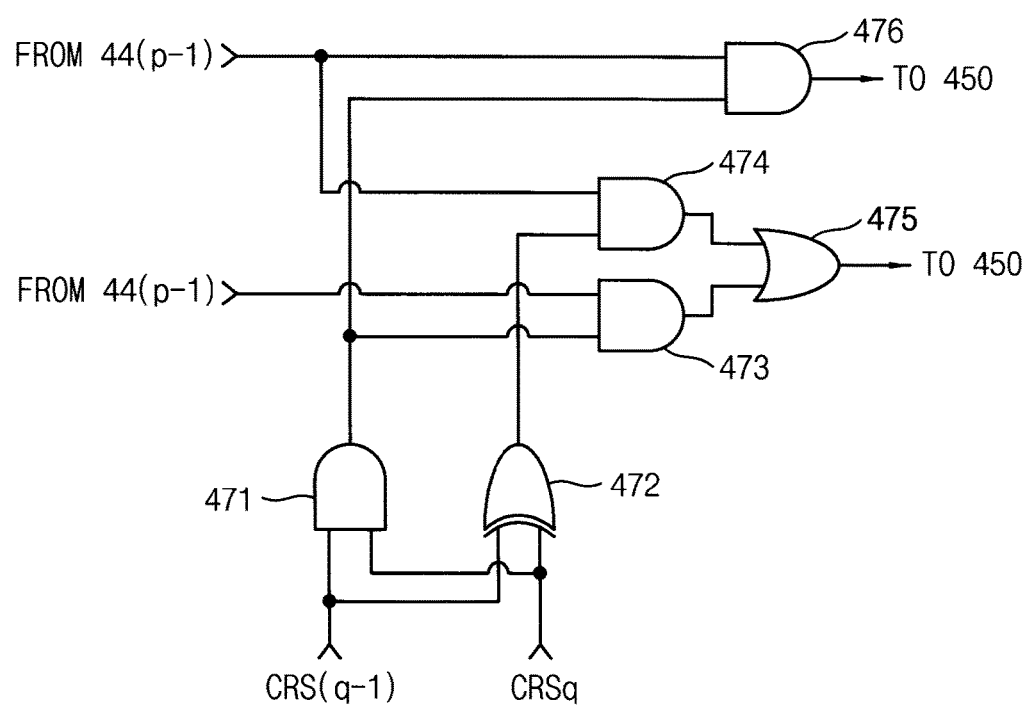
FIG. 9 illustrates one of the error counters in FIG. 8 according to some example embodiments.

FIG. 9 illustrates one of the error counters in FIG. 8 according to some example embodiments.

Referring to FIG. 9, the error counter 449 includes an AND gate 471, an XOR gate 472, AND gates 473 and 474, an OR gate 475 and an AND gate 476.

The AND gate 471 performs AND operation on two most significant bits CRS (q-1) and CRSq and the XOR gate performs XOR operation on the two most significant bits CRS (q-1) and CRSq. The AND gate 473 performs AND operation an output of the adjacent error counter 44($p$-1) and an output of the AND gate 471 and the AND gate 474 performs AND operation on the output of the adjacent error counter 44($p$-1) and an output of the XOR gate 472. The OR gate 475 performs OR operation on outputs of the AND gates 473 and 474 to output a result of the OR operation and the AND gate 476 performs the output of the adjacent error counter 44($p$-1) and the output of the AND gate 471 to output a result of the AND operation.

Figure 10A:
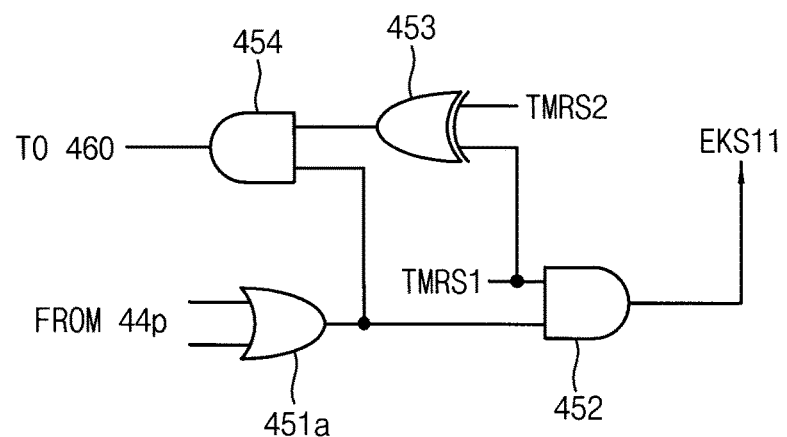
FIG. 10A illustrates an example of the logic unit in FIG. 8 according to some example embodiments.

FIG. 10A illustrates an example of the logic unit in FIG. 8 according to some example embodiments.

Referring to FIG. 10A, a logic unit 450$a$ includes an OR gate 451$a$, an AND gate 452, an XOR gate 453 and an AND gate 454. The OR gate 451$a$ receives outputs of the error counter 44$p$ to perform OR operation on the outputs of the error counter 44$p$. The AND gate 452 performs AND operation on an output of the OR gate 451$a$ and a first test mode register set signal TMRS1 to output a first error kind signal EKS11. Therefore, the AND gate 425 may output the first error kind signal EKS11 with a high level when the a number of the errors in the test result data TR is the NE or the CE and may output the first error kind signal EKS11 with a low level when the a number of the errors in the test result data TR is the UE. The XOR gate 453 performs XOR operation on the first test mode register set signal TMRS1 and a second test mode register set signal TMRS2, and the AND gate 454 performs AND operation on the output of the OR gate 451$a$ and an output of the XOR gate to provide an output to the transmission block 454.

Referring back to FIG. 8, the transmission block 460 receives the comparison result data CRS and the output of the AND gate 454 and provides the comparison result data CRS to the test device 150.

Figure 10B:
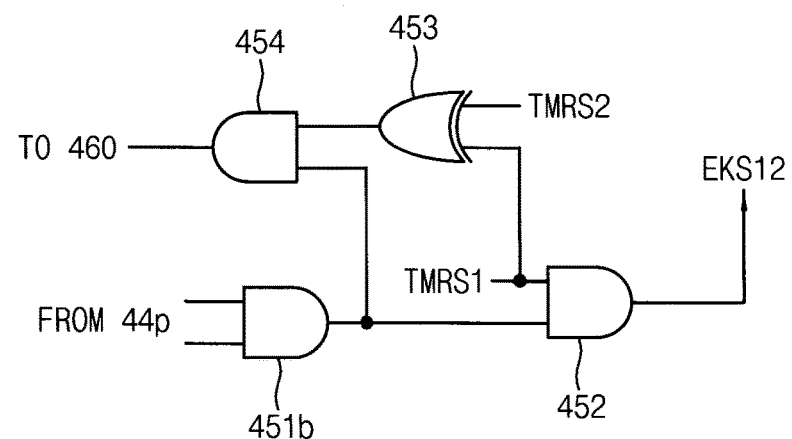
FIG. 10B illustrates an example of the logic unit in FIG. 8 according to some example embodiments.

FIG. 10B illustrates an example of the logic unit in FIG. 8 according to some example embodiments.

Referring to FIG. 10B, a logic unit 450$b$ includes an AND gate 451$b$, an AND gate 452, an XOR gate 453 and an AND gate 454. The AND gate 451$b$ receives outputs of the error counter 44$p$ to perform AND operation on the outputs of the error counter 44$p$. The AND gate 452 performs AND operation on an output of the AND gate 451$b$ and the first test mode register set signal TMRS1 to output a first error kind signal EKS12. Therefore, the AND gate 425 may output the first error kind signal EKS11 with a high level when the a number of the errors in the test result data TR is the NE or the CE and may output the first error kind signal EKS11 with a low level when the a number of the errors in the test result data TR is the UE. The XOR gate 453 performs XOR operation on the first test mode register set signal TMRS1 and a second test mode register set signal TMRS2, and the AND gate 454 performs AND operation on the output of the AND gate 451$b$ and an output of the XOR gate to provide an output to the transmission block 454.

Referring back to FIG. 8, the transmission block 460 receives the comparison result data CRS and the output of the AND gate 454 and provides the comparison result data CRS to the test device 150.

Since conventional semiconductor memory devices indicate that a memory array has passed a memory test in NE or CE cases, it is difficult for a tester to learn more information about the test result or information about the position of the CE. Therefore, even though the conventional semiconductor memory device includes an ECC circuit, the test solution cannot be provided to the control logic. However, in the semiconductor memory device according to some example embodiments, because CE information and information about the position of the CE is provided to the test device, a solution to the memory error which indicates information about the memory error as well as the position of the CE, may be provide to the semiconductor memory device 200$a$ and the test device may flexibly determine the memory error repair policy.

Figure 11:
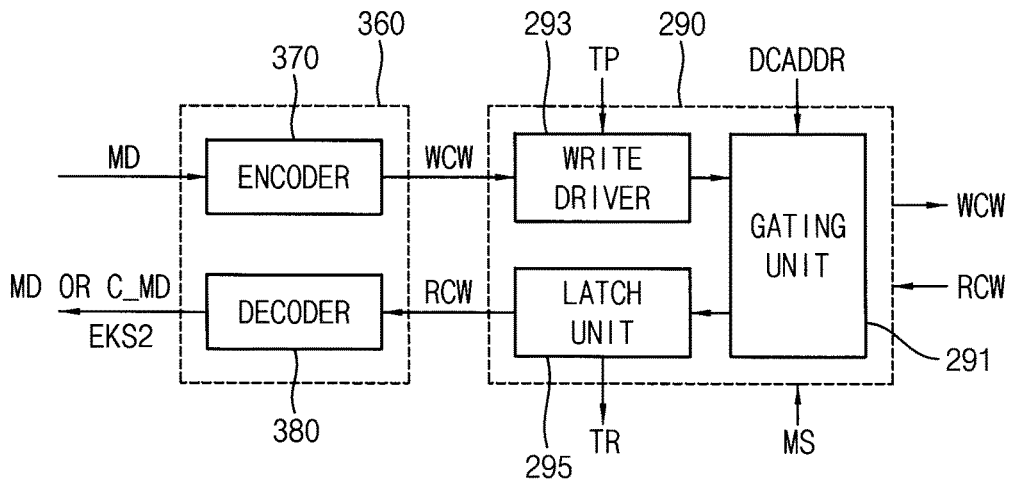
FIG. 11 illustrates the ECC circuit and the I/O gating circuit in the semiconductor memory device of FIG. 3 according to some example embodiments.

FIG. 11 illustrates the ECC circuit and the I/O gating circuit in the semiconductor memory device of FIG. 3 according to some example embodiments.

Referring to FIG. 3, the ECC circuit 360 includes an encoder 370 and a decoder 380. The I/O gating circuit 290 includes a gating unit 291, a write driver 293 and a latch unit 295.

The encoder 370 receives the main data MD including a plurality of unit data, encodes the main data MD to generate the parity data and provides the write driver 293 with the codeword (or a write codeword) WCW having the main data MD and the parity data in a write operation. The decoder 380 receives the codeword (or a read codeword) RCW from the I/O gating circuit 290, corrects errors in the main data MD using the parity data in the codeword RCW and provides the corrected main data MD or C_MD to the memory controller 110 though the data I/O buffer 299 in a read operation. The decoder 380 determines correctability of the errors in the codeword CW by the second unit and provides the register unit 480 with the second error kind signal EKS2 indicating the correctability of the errors in the codeword CW.

The gating unit 291 gates the write codeword WCW from the write driver 293 to the memory cell array 300 in response to a decoded column address DCADDR and gates the read codeword RCW from the memory cell array 300 to the lath unit 295 in a normal mode. The gating unit 291 gates the test pattern data TP from the write driver 293 to the memory cell array 300 and gates the test result data TR from the memory cell array 300 to the lath unit 295 in the test mode. The latch unit 295 provides the decoder 380 with the read codeword RCW in the normal mode and provides the error decision circuit 400 with the test result data TR in the test mode in response to the mode signal MS.

Figure 12:
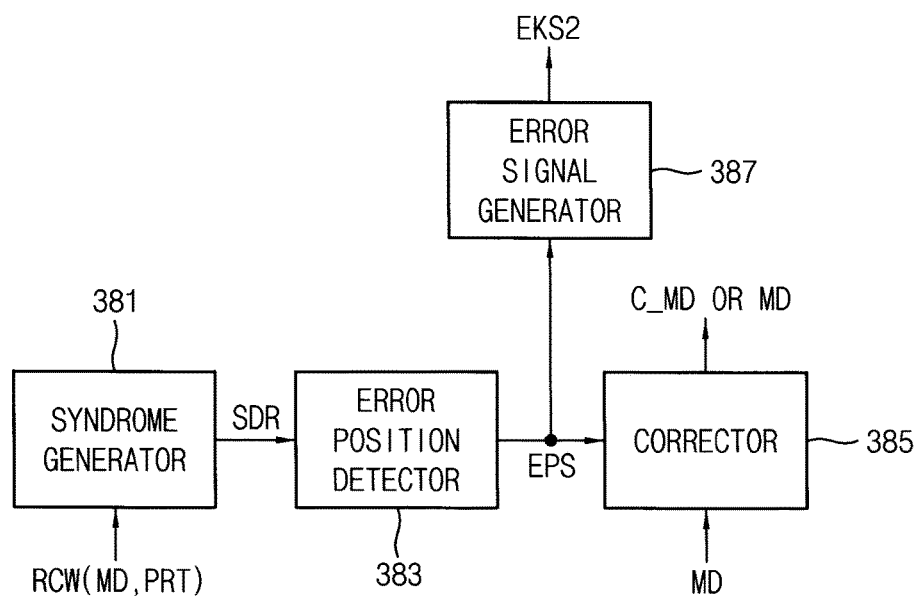
FIG. 12 is a block diagram illustrating an example of the decoder in the ECC circuit in FIG. 11 according to some example embodiments.

FIG. 12 is a block diagram illustrating an example of the decoder in the ECC circuit in FIG. 11 according to some example embodiments.

Referring to FIG. 12, the decoder 380 includes a syndrome generator 381, an error position detector 383, an error corrector 385 and an error signal generator 387.

The syndrome generator 381 may generate syndromes SDR based on the main data MD and the parity data PRT in the read codeword RCW. The error position detector 383 may detect a position of errors in the main data MD based on the syndromes SDR to generate an error position signal EPS. For example, the error position detector 383 may calculate coefficients of error position polynomial using two or more syndromes SDR and may detect the error position to generate the error position signal EPS based on the coefficients. The error corrector 385 may correct errors in the main data MD based on the error position signal EPS to provide the corrected main data C_MD. The error corrector 385 may provide the main data MD when there is no error in the main data MD. The error signal generator 387 may provide the register unit 480 with the second error kind signal EKS2 indicating the correctability of the errors in the main data MD based on the error position signal EPS.

Figure 13:
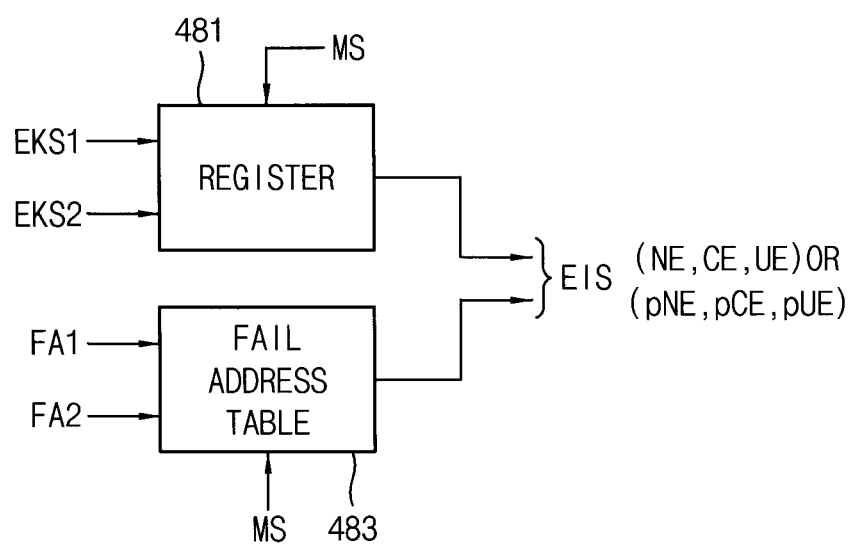
FIG. 13 is a block diagram illustrating the register unit in semiconductor memory device of FIG. 3 according to some example embodiments.

FIG. 13 is a block diagram illustrating the register unit in semiconductor memory device of FIG. 3 according to some example embodiments.

Referring to FIG. 13, the register unit 480 may include a register 481 and a fail address table 483.

The register 481 may store the first error kind signal EKS1 and the second error kind signal EKS2. The fail address table 483 may store the first fail address FA1 associated with the first error kind signal EKS1 in the test mode and may store the second fail address FA2 associated with the second error kind signal EKS2 in the normal mode. The register 481 outputs the first error kind signal EKS1 in the test mode and outputs the second error kind signal EKS2 in the normal mode in response to the mode signal MS. The fail address table 483 outputs the first fail address FA1 in the test mode and outputs the second fail address FA2 in the normal mode in response to the mode signal MS. Therefore, the register unit 480 may provide the memory controller 100 with the first error kind signal EKS1 and the first fail address FA1 as the error information signal EIS in the test mode and may provide the memory controller 100 with the second error kind signal EKS2 and the second fail address FA2 as the error information signal EIS in the normal mode. As described above, the error information signal EIS may include one of the NE, the CE and the UE or one of the pNE the pCE and the pUE according to a size of the first unit or the second unit.

Figure 14:
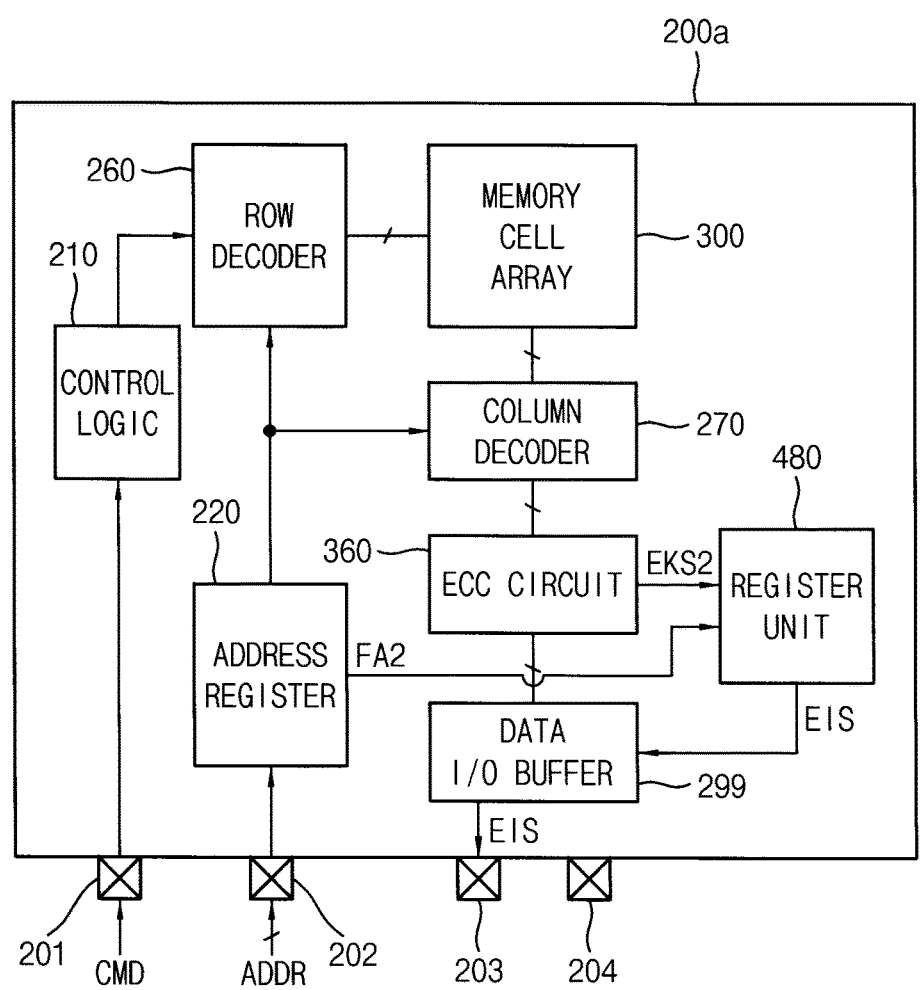
FIG. 14 and FIG. 15 respectively illustrate a path through which the error information signal is transferred in the normal mode in the semiconductor memory device of FIG. 3 according to some example embodiments.
Figure 15:
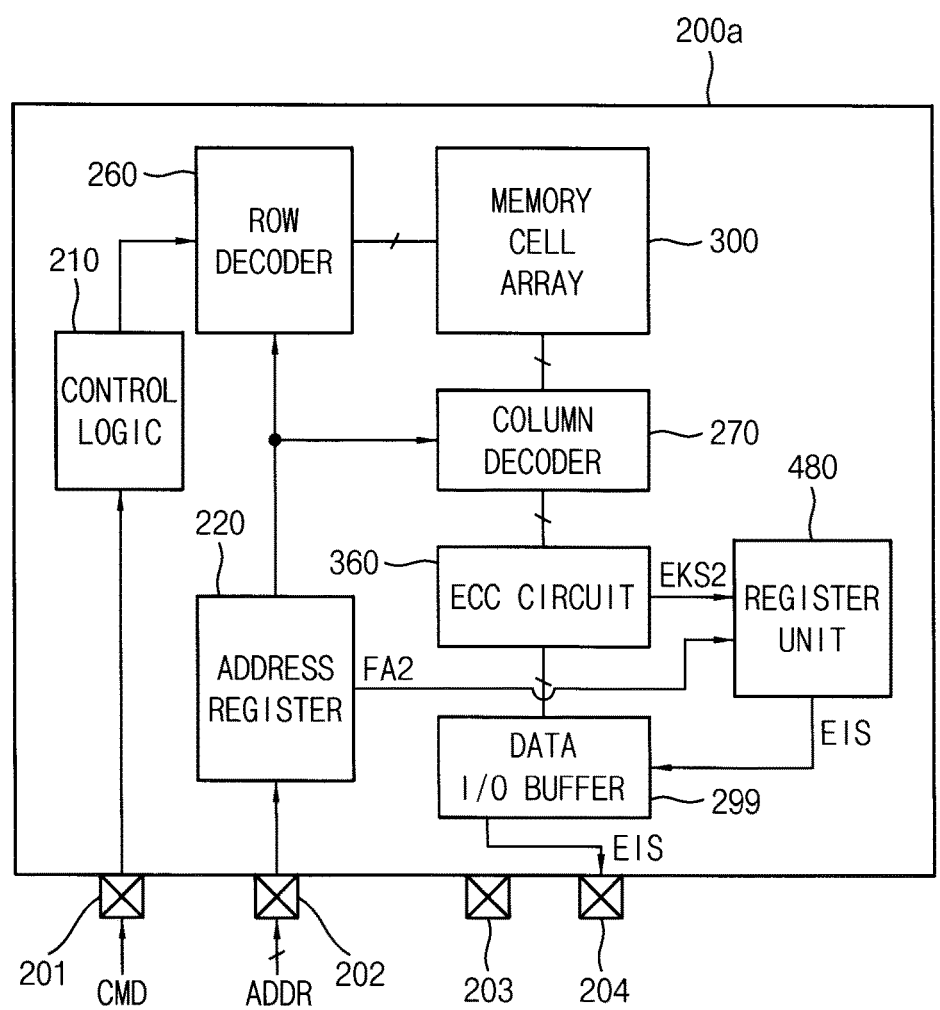

FIG. 14 and FIG. 15 respectively illustrate a path through which the error information signal is transferred in the normal mode in the semiconductor memory device of FIG. 3.

In FIG. 14 and FIG. 15, the control logic 210, the address register 20, the row decoder 260, the column decoder 270, the memory cell array 300, the ECC circuit 360, the data I/O buffer 299 and the register unit 480 are illustrated in the semiconductor memory device 200a of FIG. 3. In addition, the command pin 201, the address pin 202, the data pin 203 and the extra pin 204 are also illustrated.

Referring to FIG. 14, the ECC circuit 360 provides the second error kind signal EKS2 to the register unit 480 and the address register 220 provides the second fail address FA2 to the register unit 480. The register unit 480 provides the data I/O buffer 299 with the error information signal EIS including the second error kind signal EKS1 and the second fail address FA2 and the data I/O buffer 299 provides the memory controller 100 with the error information signal EIS via the data pin 203 under the control of the control logic 210. The memory controller 100 may determine the repair policy of the semiconductor memory device 200a based on the error information signal EIS. When the main data MD includes the UE, the memory controller 100 controls the semiconductor memory device 200a such that a page associated with the UE is replaced with a page without defects.

Referring to FIG. 15, the ECC circuit 360 provides the second error kind signal EKS2 to the register unit 480 and the address register 220 provides the second fail address FA2 to the register unit 480. The register unit 480 provides the data I/O buffer 299 with the error information signal EIS including the second error kind signal EKS1 and the second fail address FA2 and the data I/O buffer 299 provides the memory controller 100 with the error information signal EIS via the extra pin 204 under the control of the control logic 210. The extra pin may be a data mask pin. Since the data mask pin is used for masked write operation, the data mask pin is used for transferring the error information signal EIS to the memory controller 100 in the read operation. The memory controller 100 may determine the repair policy of the semiconductor memory device 200a based on the error information signal EIS. When the main data MD includes the UE, the memory controller 100 controls the semiconductor memory device 200a such that a page associated with the UE is replaced with a page without defects.

Figure 16A:
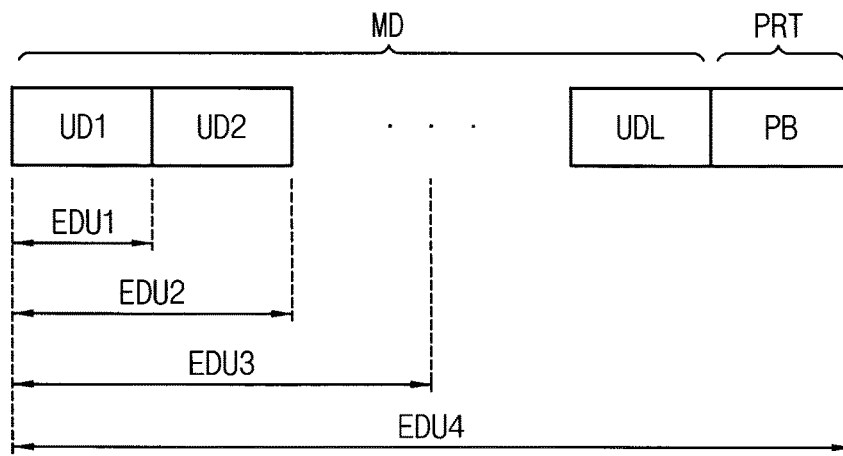
FIG. 16A illustrates a relationship between the codeword and the unit by which correctability of errors is determined (error determination unit) according to some example embodiments.

FIG. 16A illustrates a relationship between the codeword and the unit by which correctability of errors is determined (error determination unit) according to some example embodiments.

Referring to FIG. 16A, the codeword CW may include the main data MD having a plurality of unit data UD1~UDL (where L is a natural number greater than 2) and the parity data PRT having parity bits PB.

The error decision circuit 400 in FIG. 3 may determine the correctability of the errors in the codeword CW by the first unit whose size is equal to or smaller than the size of the codeword CW to output the first error kind signal EKS1 indicating the determination result. The ECC circuit 360 in FIG. 3 may determine the correctability of the errors in the codeword CW by the second unit whose size is equal to or smaller than the size of the codeword CW to output the second error kind signal EKS2 indicating the determination result. The size of the first unit or the second unit, that is the error determination unit EDU is equal to the size of the unit data UD1 as an error determination unit EDU1, greater than the size of the unit data UD1 as error determination units EDU2 and EDU3 or equal to the size of the codeword CW as in an error determination unit EDU4.

Figure 16B:
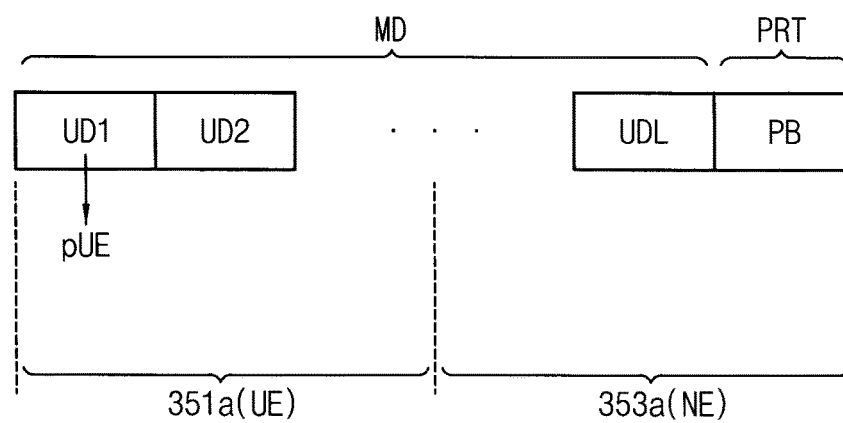
FIG. 16B through 16D respectively illustrate error repair policies when the codeword includes the uncorrectable error according to some example embodiments.
Figure 16C:
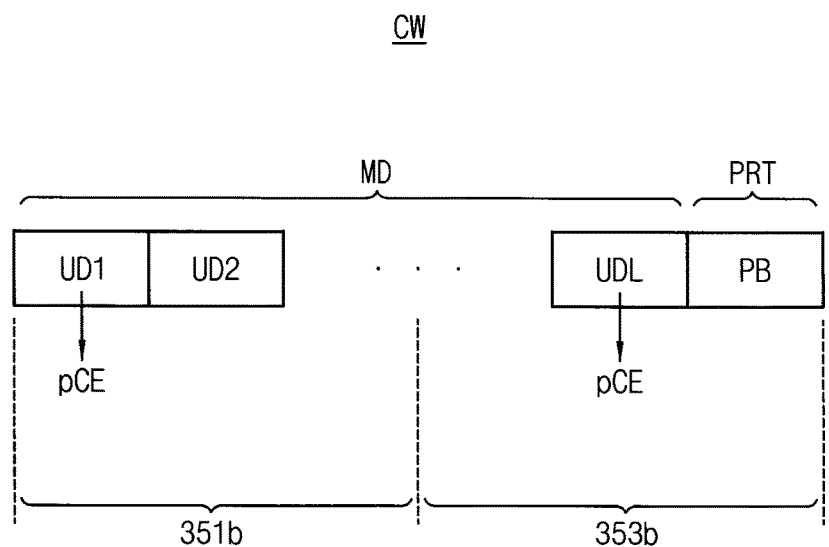
Figure 16D:
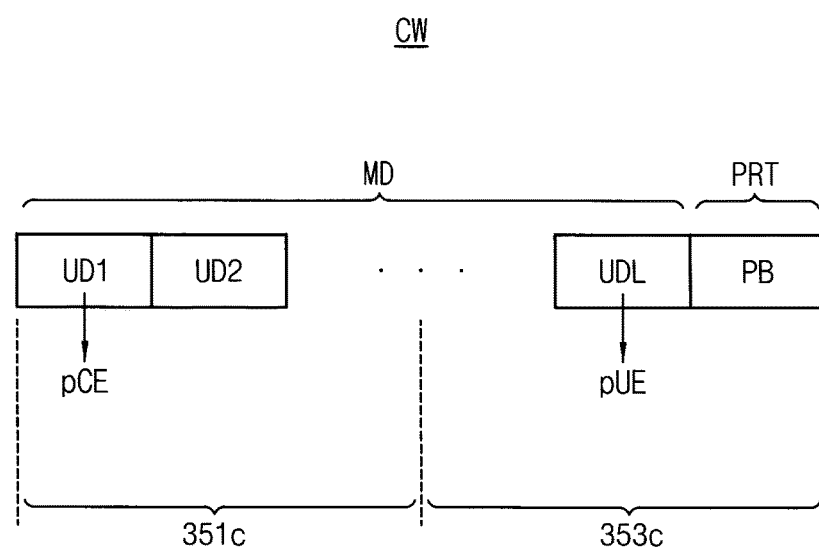

FIG. 16B through 16D respectively illustrate error repair policies when the codeword includes the uncorrectable error.

FIG. 16B through 16D respectively illustrate error repair policies when the codeword includes the uncorrectable error UE in case when the size of the error determination unit is smaller than the size of the codeword CW, that is, when the size of the error determination unit is a half of the size of the codeword CW.

Referring to FIG. 16B, the unit data UD1 includes the pUE, a half codeword 351*a* of the codeword CW includes the UE and a half codeword 353*a* of the codeword CW includes the NE. In this case, the test device 150 in FIG. 6 may determine the error repair policy such that the half codeword 351*a* having the UE is replaced with a redundancy page having the NE or the CE. Therefore, the test device 150 may store an address of the half codeword 351*a* as the fail address in the address comparing unit 225. In addition, the memory controller 100 may control the semiconductor memory device 200*a* such that the half codeword 351*a* having the UE is replaced with a redundancy page having the NE or the CE.

Referring to FIG. 16C, since the unit data UD1 includes the pCE, a half codeword 351*b* of the codeword CW includes the CE and since the unit data UDL includes the pCE, a half codeword 353*b* of the codeword CW includes the CE. In this case, the test device 150 in FIG. 6 may determine the error repair policy such that the half codeword 351*b* having the CE or the half codeword 353*b* having the CE is replaced with a redundancy page having the NE. Therefore, the test device 150 may store an address of the half codeword 351*b* or the half codeword 353*b* as the fail address in the address comparing unit 225. In addition, the memory controller 100 may control the semiconductor memory device 200*a* such that the half codeword 351*b* having the CE is replaced with a redundancy page having the NE. In addition, the memory controller 100 may control the semiconductor memory device 200*a* such that the half codeword 353*b* having the CE is corrected in the ECC circuit 360.

Referring to FIG. 16D, since the unit data UD1 includes the pCE, a half codeword 351*c* of the codeword CW includes the CE and since the unit data UDL includes the uCE, a half codeword 353*c* of the codeword CW includes the UE. In this case, the test device 150 in FIG. 6 may determine the error repair policy such that the half codeword 353*c* having the UE is replaced with a redundancy page having the NE. Therefore, the test device 150 may store an address of the half codeword 353*c* as the fail address in the address comparing unit 225. In addition, the memory controller 100 may control the semiconductor memory device 200*a* such that the half codeword 353*c* having the UE is replaced with a redundancy page having the NE. In addition, the memory controller 100 may control the semiconductor memory device 200*a* such that the half codeword 351*c* having the CE is corrected in the ECC circuit 360.

Accordingly, in the memory system according to some example embodiments, the memory controller or the test device utilizes numbers and positions of the correctable errors as information for error monitoring, quality level and test solution. In addition, the memory system set a size of error repair unit smaller than a size of the codeword to utilize redundancy resource efficiently.

Figure 17:
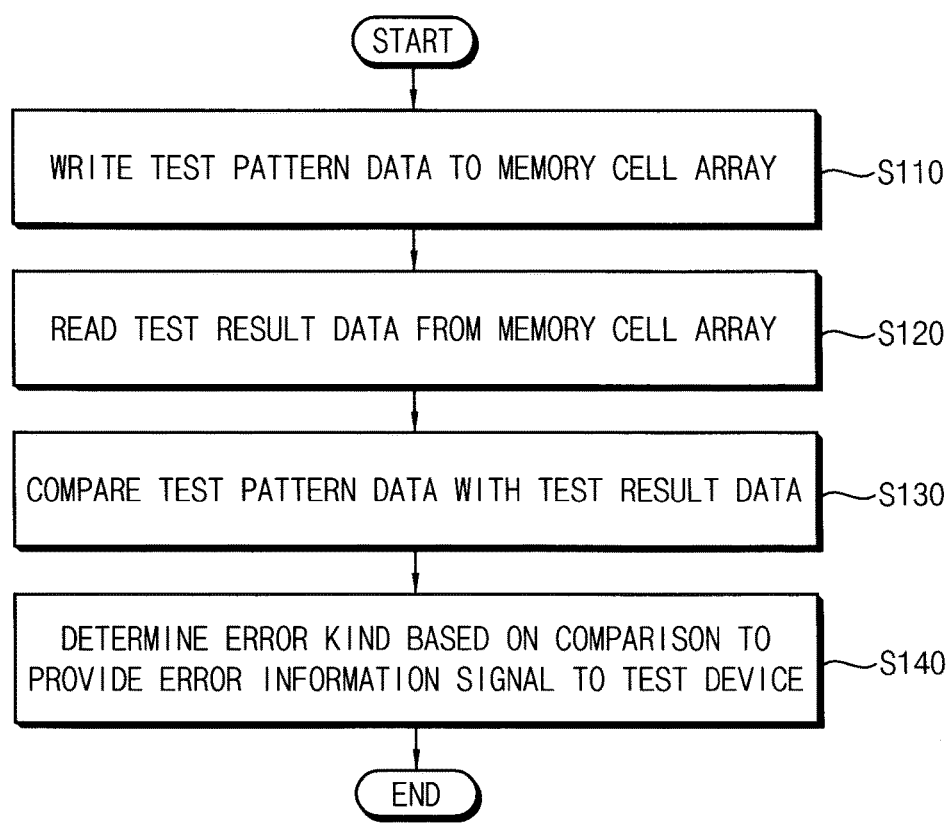
FIG. 17 is a flow chart illustrating a method of operating a memory system according to some example embodiments.

FIG. 17 is a flow chart illustrating a method of operating a memory system according to some example embodiments.

Referring to FIGS. 3 through 10B, 16A and 17, the I/O gating circuit 290 writes the test pattern data TP in the memory cell array 300 in the test mode (S110). The I/O gating circuit 290 reads the pattern data TP from the memory cell array 300 as the test result data TR (S120). The error decision circuit 400 compares corresponding bits of the test result data TR and the test pattern data TP internally stored (S130). The error decision circuit 400 provides the register unit 480 with the first error kind signal EKS1 indicating the correctability of the errors in the test result data TR based on the comparison result. The kind of errors may be one of the NE, the CE and the UE or one of the pNE, the pCE and the pUE according to the size of the error determination unit. The register unit 480 provides the test device 150 with the first error kind signal EKS1 and the first fail address FA1 associated with the first error kind signal EKS1 as the error information signal EIS (S140). The test device 150 may determine the error repair policy based on the error information signal EIS.

Figure 18:
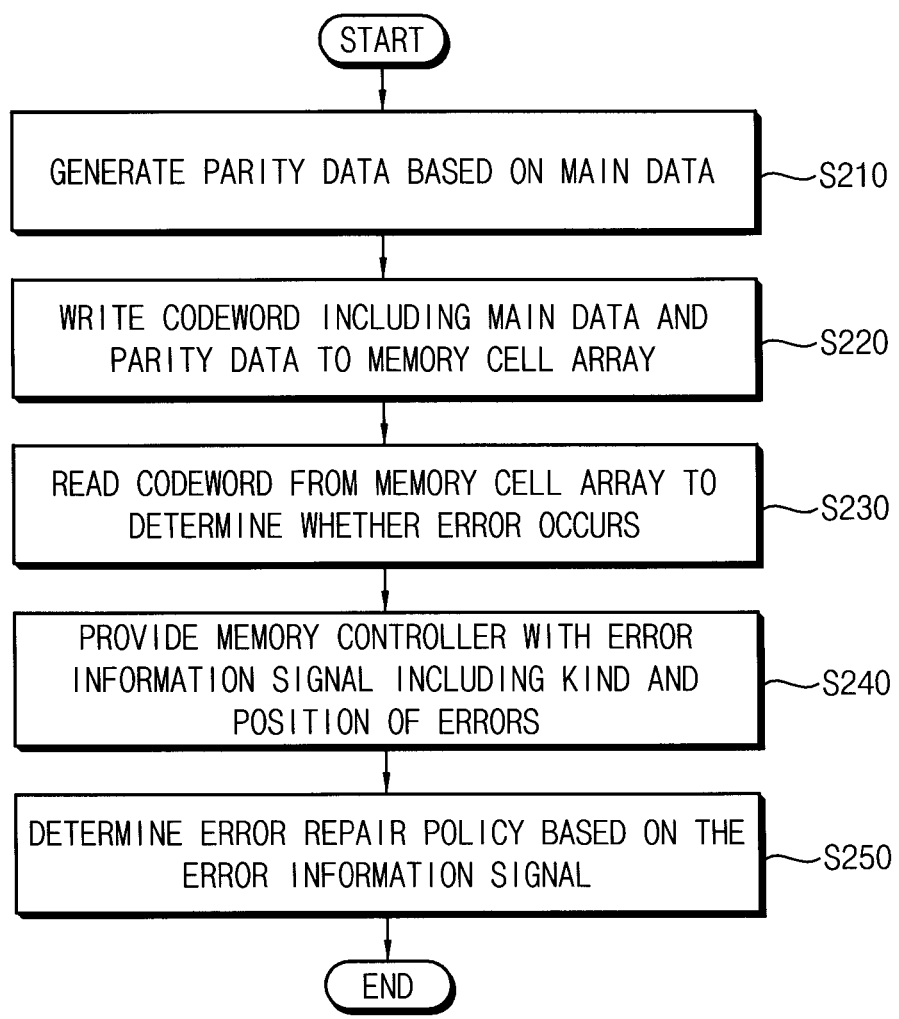
FIG. 18 is a flow chart illustrating a method of operating a memory system according to some example embodiments.

FIG. 18 is a flow chart illustrating a method of operating a memory system according to some example embodiments.

Referring to FIGS. 2 through 5, 11 through 16D and 18, the encoder 370 of the ECC circuit 360 generates the parity data PRT based on the main data MD (S210). The I/O gating circuit 290 writes the codeword CW having the main data MD and the parity data PRT in the memory cell array 300 in the normal mode (S220). The I/O gating circuit 290 reads the codeword CW from the memory cell array 300 to provide the codeword CW to the ECC circuit 360 and the decoder 380 of the ECC circuit 360 determines whether the main data MD has errors using the parity data (S230). The decoder 380 of the ECC circuit 360 detects the position of the errors using the syndromes SDR to provide the register unit 480 with the second error kind signal EKS2. The register unit 480 provides the memory controller 100 with the second error kind signal EKS2 and the second fail address FA2 associated with the second error kind signal EKS2 as the error information signal EIS (S240). The memory controller 100 may determine the error repair policy based on the error information signal EIS (S250). As described with reference to FIGS. 16A through 16D, the memory system sets a size of error repair unit smaller than a size of the codeword to utilize redundancy resource efficiently.

Figure 19:
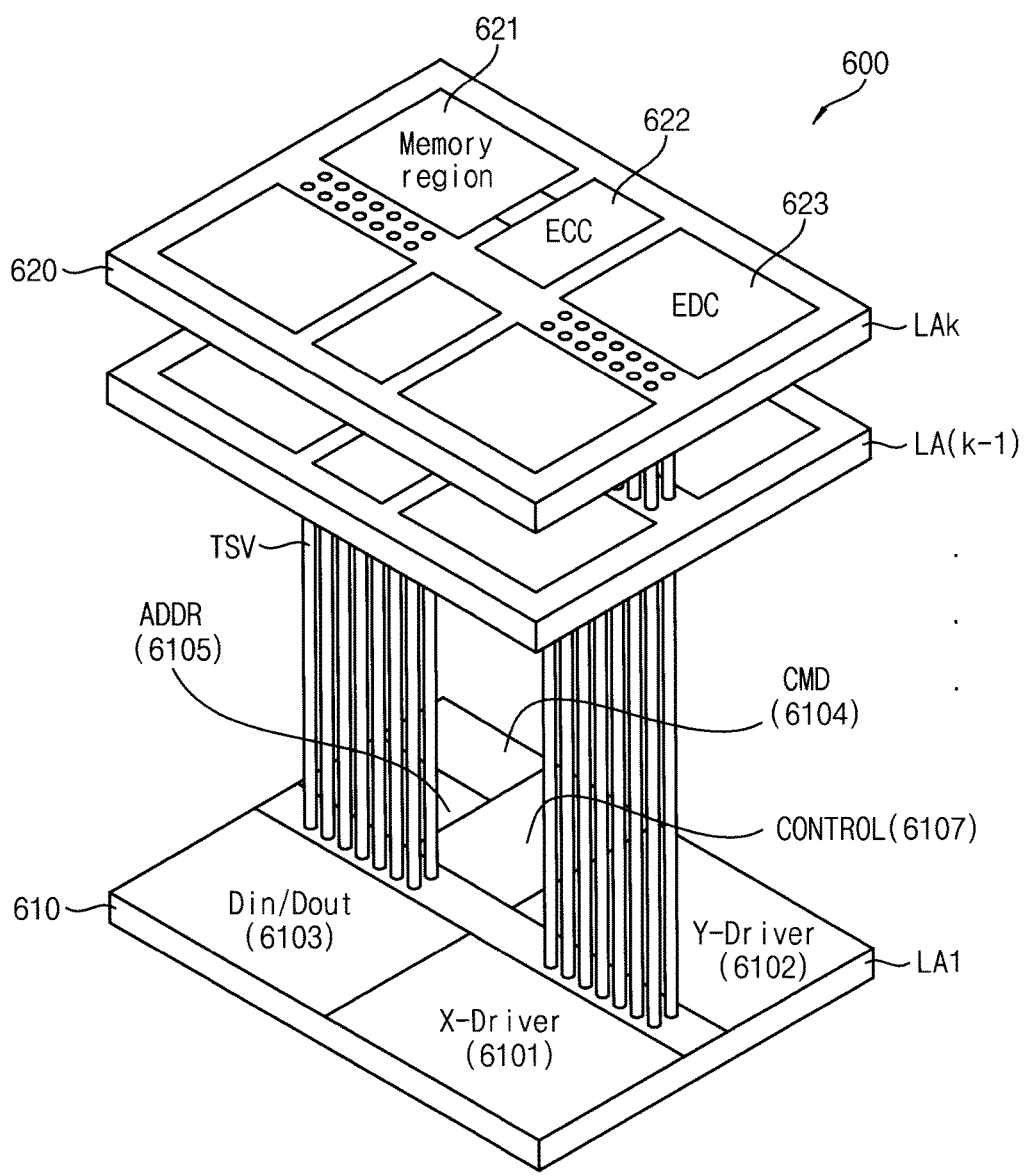
FIG. 19 is a structural diagram illustrating a semiconductor memory device according to some example embodiments.

FIG. 19 is a structural diagram illustrating a semiconductor memory device according to some example embodiments.

Referring to FIG. 19, a semiconductor memory device 600 may include first through kth semiconductor integrated circuit layers LA1 through LAk, in which the lowest first semiconductor integrated circuit layer LA1 is assumed to be an interface or control chip and the other semiconductor integrated circuit layers LA2 through LAk are assumed to be slave chips including core memory chips. The first through kth semiconductor integrated circuit layers LA1 through LAk may transmit and receive signals there between through through-silicon-vias (TSVs). The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the nth semiconductor integrated circuit layer LAk or 620 as the slave chip.

The first semiconductor integrated circuit layer 610 may include various peripheral circuits for driving memory regions 621 provided in the gth (g is a natural number greater than 2) semiconductor integrated circuit layer 620. For example, the first semiconductor integrated circuit layer 610 may include a row (X)-driver 6101 for driving wordlines of a memory, a column (Y)-driver 6102 for driving bit lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include a normal cell array that stores the main data and the parity data and a redundancy cell array for repairing defects in the normal cell array as described with reference to FIG. 5.

The first semiconductor integrated circuit layer 610 may further include a control logic 6107. The control logic 6107 may control an access to the memory region 621 based on a command and an address signal from a memory controller and may generate control signals for accessing the memory region 621.

The kth semiconductor integrated circuit layer 620 may include an ECC circuit 622 that corrects errors in the memory cells in the memory region 621 and an error decision circuit 623 that determines correctability of the errors in the memory cells in the memory region 621 in the test mode. The error decision circuit 623 may compare corresponding bits of the test result data and the test pattern data to provide the first error kind signal indicating the correctability of the errors in the test result data in the test mode as described with reference to FIGS. 7 through 10. The ECC circuit 622 may provide the second error kind signal indicating the kind of errors in the main data in the normal mode. Accordingly, in the semiconductor memory device 600, the test device or the memory controller utilizes numbers and positions of the correctable errors as information for error monitoring, quality level and test solution. In addition, the test device or the memory controller sets a size of error repair unit smaller than a size of the codeword to utilize redundancy resource efficiently.

Figure 20:
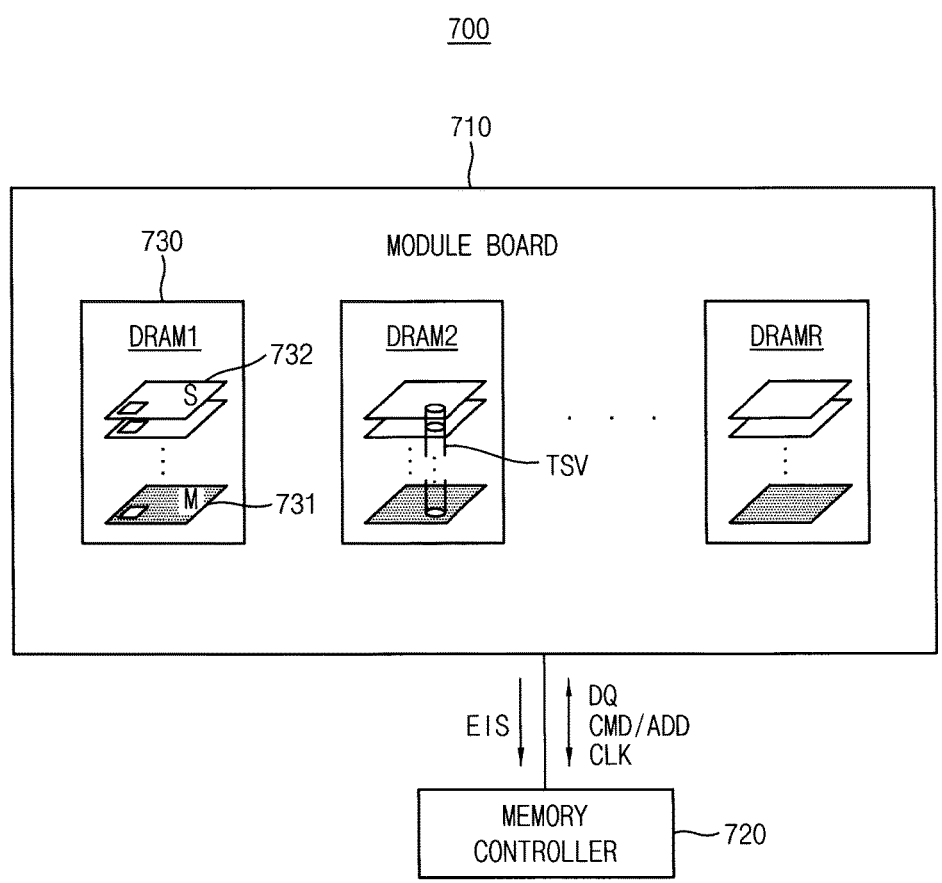
FIG. 20 illustrates a memory system including the semiconductor memory device according to some example embodiments.

FIG. 20 illustrates a memory system including the semiconductor memory device according to some example embodiments.

Referring to FIG. 20, a memory system 700 may include a memory module 710 and a memory controller 720. The memory module 710 may include at least one semiconductor memory device 730 mounted on a module board. The semiconductor memory device 730 may employ the semiconductor memory device 200a of FIG. 3. For example, the semiconductor memory device 730 may be constructed as a DRAM chip. In addition, the semiconductor memory device 730 may include a stack of semiconductor chips. In this case, the semiconductor chips may include at least one master chip 731 and at least one slave chip 732. Signal transfer between the semiconductor chips may occur via through-silicon vias TSV.

The master chip 731 and the slave chip 732 may employ the semiconductor memory device 200a of FIG. 3. Therefore, the semiconductor memory device may include an ECC circuit that corrects errors in the memory cells and an error decision circuit that determines correctability of the errors in the memory cells in the test mode. Therefore, in the semiconductor memory device, the test device or the memory controller utilizes numbers and positions of the correctable errors as information for error monitoring, quality level and test solution. In addition, the test device or the memory controller sets a size of error repair unit smaller than a size of the codeword to utilize redundancy resource efficiently.

The memory module 710 may communicate with the memory controller 720 via a system bus. Data DQ, a command/address CMD/ADD, and a clock signal CLK may be transmitted and received between the memory module 710 and the memory controller 720 via the system bus. In addition, each of the semiconductor memory devices provides the memory controller 720 with the error kind signal indicating the kind of errors and the fail address associated with the error kind signal as the error information signal EIS and the memory controller 720 may determine the error repair policy of the semiconductor memory devices based on the error information signal EIS.

Figure 21:
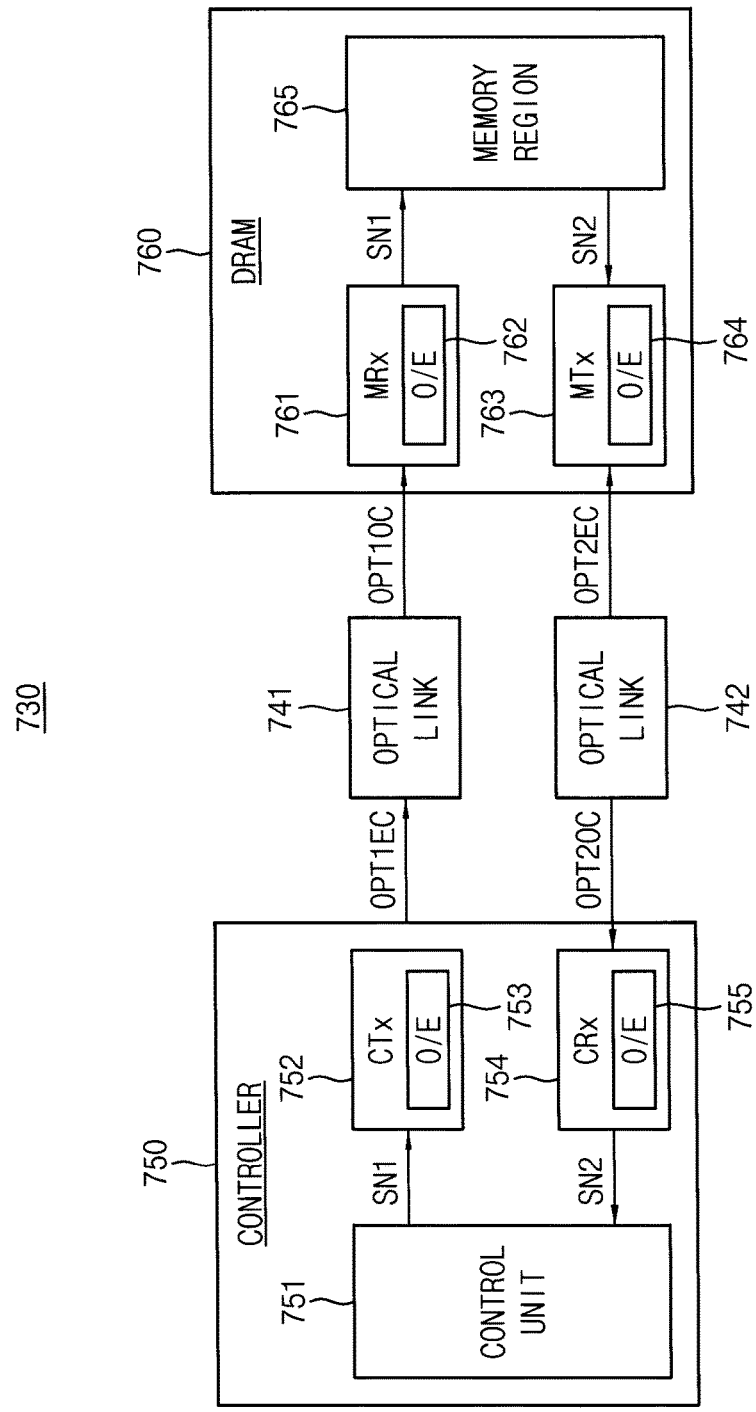
FIG. 21 is a block diagram illustrating a memory system including the semiconductor memory device according to some example embodiments.

FIG. 21 is a block diagram illustrating a memory system including the semiconductor memory device according to some example embodiments.

Referring to FIG. 21, a memory system 730 may include optical links 741 and 742, a controller 750, and a semiconductor memory device 760. The optical links 741 and 742 interconnect the controller 750 and the semiconductor memory device 760. The controller 750 may include a control unit 751, a first transmitter 752, and a first receiver 754. The control unit 751 may transmit a first electrical signal SN1 to the first transmitter 752. The first electrical signal SN1 may include command signals, clock signals, address signals, or write data transmitted to the semiconductor memory device 760. The semiconductor memory device 760 may include an ECC circuit that corrects errors in the memory cells and an error decision circuit that determines correctability of the errors in the memory cells in the test mode. Therefore, in the semiconductor memory device 760, the test device or the memory controller utilizes numbers and positions of the correctable errors as information for error monitoring, quality level and test solution. In addition, the test device or the memory controller sets a size of error repair unit smaller than a size of the codeword to utilize redundancy resource efficiently.

The first transmitter 752 may include a first optical modulator 753, and the first optical modulator 753 may convert the first electrical signal SN1 into a first optical transmission signal OTP1EC and may transmit the first optical transmission signal OTP1EC to the optical link 741. The first optical transmission signal OTP1EC may be transmitted by serial communication through the optical link 741. The first receiver 754 may include a first optical demodulator 755, and the first optical demodulator 755 may convert a second optical reception signal OPT2OC received from the optical link 742 into a second electrical signal SN2 and may transmit the second electrical signal SN2 to the control unit 750.

The semiconductor memory device 760 may include a second receiver 761, a memory region 765 including a plurality of dynamic memory cells, and a second transmitter 764. Also, the semiconductor memory device 760 may include an interface unit that provides various interface functions. The second receiver 761 may include a second optical demodulator 762, and the second optical demodulator 762 may convert the first optical reception signal OPT1OC received from the optical link 741 into the first electrical signal SN1 and may transmit the first optical reception signal OPT1OC to the memory region 765.

In the memory region 765, write data is written to the dynamic memory cells in response to the first electrical signal SN1, or data read from the memory region 765 is transmitted as a second electrical signal SN2 to the second transmitter 764. The second electrical signal SN2 may include clock signals and read data transmitted to the memory controller 750. The second transmitter 763 may include a second optical modulator 764, and the second optical modulator 764 may convert the second electrical signal SN2 into the second optical data signal OPT2EC and transmits the second optical data signal OPT2EC to the optical link 742. The second optical transmission signal OTP2EC may be transmitted by serial communication through the optical link 742.

Figure 22:
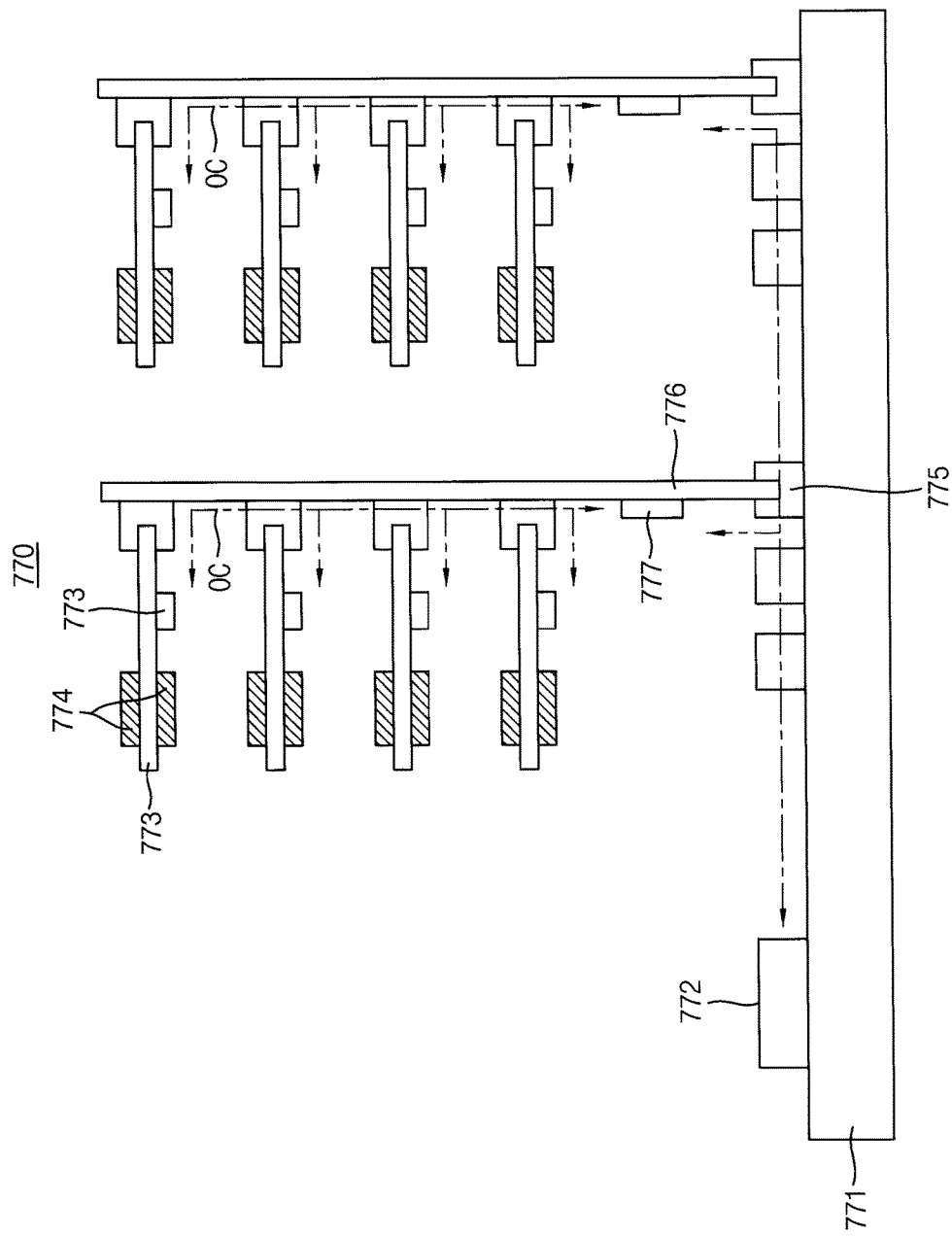
FIG. 22 is a block diagram illustrating a server system including the semiconductor memory device according to some example embodiments.

FIG. 22 is a block diagram illustrating a server system including the semiconductor memory device according to some example embodiments.

Referring to FIG. 22, a server system 770 includes a memory controller 772 and a plurality of memory modules 773. Each of the memory modules 773 may include a plurality of semiconductor memory devices 774. Each of the semiconductor memory devices 774 may include an ECC circuit that corrects errors in the memory cells and an error decision circuit that determines correctability of the errors in the memory cells in the test mode. Therefore, in each of the semiconductor memory devices 774, the test device or the memory controller utilizes numbers and positions of the correctable errors as information for error monitoring, quality level and test solution. In addition, the test device or the memory controller sets a size of error repair unit smaller than a size of the codeword to utilize redundancy resource efficiently.

In the server system 770, a second circuit board 776 is coupled to each of sockets 775 of a first circuit board 771. The server system 770 may be designed to have a channel structure in which one second circuit board 776 is connected to the first circuit board 771 according to signal channels.

Meanwhile, a signal of the memory modules 773 may be transmitted via an optical IO connection. For the optical IO connection, the server system 770 may further include an electric-to-optical conversion unit 777, and each of memory modules 773 may further include an optical-to-electrical conversion unit 778.

The memory controller 772 is connected to the electric-to-optical conversion unit 777 through an electrical channel EC. The electric-to-optical conversion unit 777 converts an electrical signal received from the memory controller 772 through the electrical channel EC into an optical signal and transmits the optical signal to an optical channel OC. Also, the electric-to-optical conversion unit 777 converts an optical signal received through the optical channel OC into an electrical signal and transmits the electrical signal to the electrical channel EC.

The memory module 773 is connected to the electric-to-optical conversion unit 777 through the optical channel OC. An optical signal applied to the memory module 773 may be converted into an electrical signal through the optical-to-electric conversion unit 778 and may be transmitted to the semiconductor memory chips 774. The server system 770 including the optical connection memory modules may support high storage capacity and a high processing speed.

Figure 23:
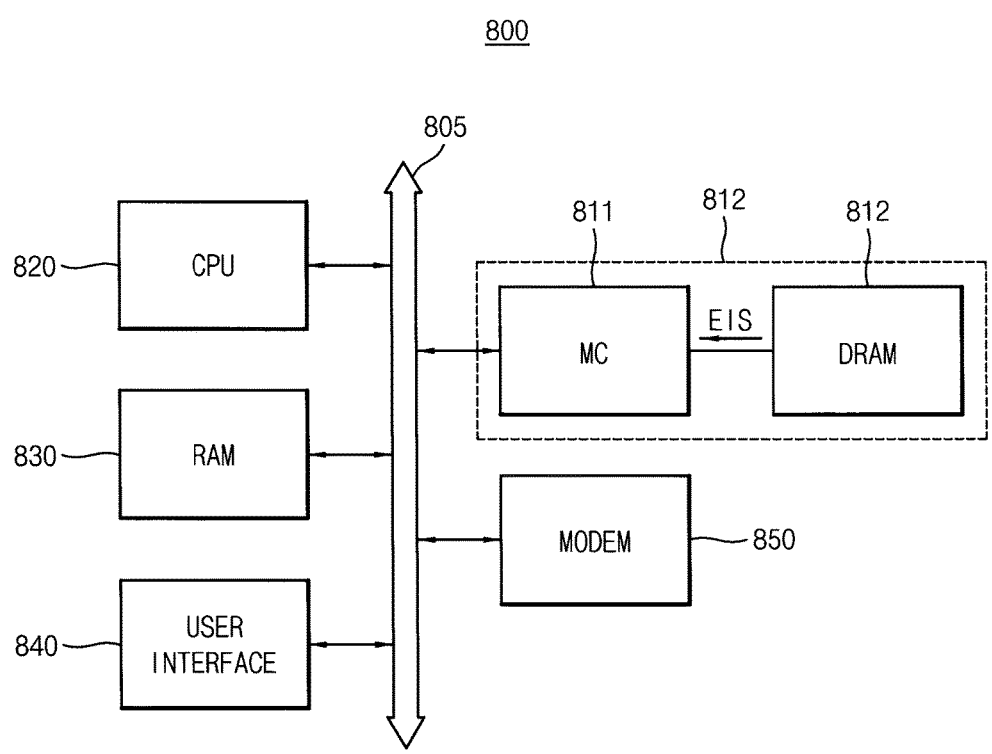
FIG. 23 is a block diagram illustrating a computing system including the semiconductor memory device according to some example embodiments.

FIG. 23 is a block diagram illustrating a computing system including the semiconductor memory device according to some example embodiments.

Referring to FIG. 23, a computing system 800 may be mounted on a mobile device or a desktop computer. The computing system 800 may include a memory system 810, a central processing unit (CPU) 820, a RAM 830, a user interface 840, and a modem 850 such as a baseband chipset, which are electrically connected to a system bus 805. The computing system 800 may further include an application chipset, a camera image processor (CIS), and an input/output device.

The user interface 840 may be an interface for transmitting data to a communication network or receiving data from the communication network. The user interface 840 may have a wired or wireless form, and may include an antenna or a wired/wireless transceiver. Data applied through the user interface 840 or the modem 850 or processed by the CPU 820 may be stored in the memory system 810.

The memory system 810 includes a semiconductor memory device 812 such as DRAM and a memory controller 811. Data processed by the CPU 820 or external data is stored in the semiconductor memory device 812. The semiconductor memory device 812 may include an ECC circuit that corrects errors in the memory cells and an error decision circuit that determines correctability of the errors in the memory cells in the test mode. Therefore, in the semiconductor memory device 812, the test device or the memory controller utilizes numbers and positions of the correctable errors as information for error monitoring, quality level and test solution. In addition, the test device or the memory controller sets a size of error repair unit smaller than a size of the codeword to utilize redundancy resource efficiently. The semiconductor memory device 812 provides the memory controller 811 with the error kind signal indicating the kind of errors and the fail address associated with the error kind signal as the error information signal EIS and the memory controller 811 may determine the error repair policy of the semiconductor memory device 812 based on the error information signal EIS.

When the computing system 800 is a device that performs wireless communications, the computing system 800 may be used in a communication system such as code division multiple access (CDMA), global system for mobile communication (GSM), North American multiple access (NADC), or CDMA2000. The computing system 800 may be mounted on an information processing device such as a personal digital assistant (PDA), a portable computer, a web tablet, a digital camera, a portable media player (PMP), a mobile phone, a wireless phone, or a laptop computer.

Although a system includes a separate storage unit for storing a large amount of data such as a cache memory or a RAM having a high processing speed, these memories may be replaced by one memory system of the present disclosure. Accordingly, since a large amount of data may be rapidly stored in a memory device, a computing system may have a simple structure.

Figure 24:
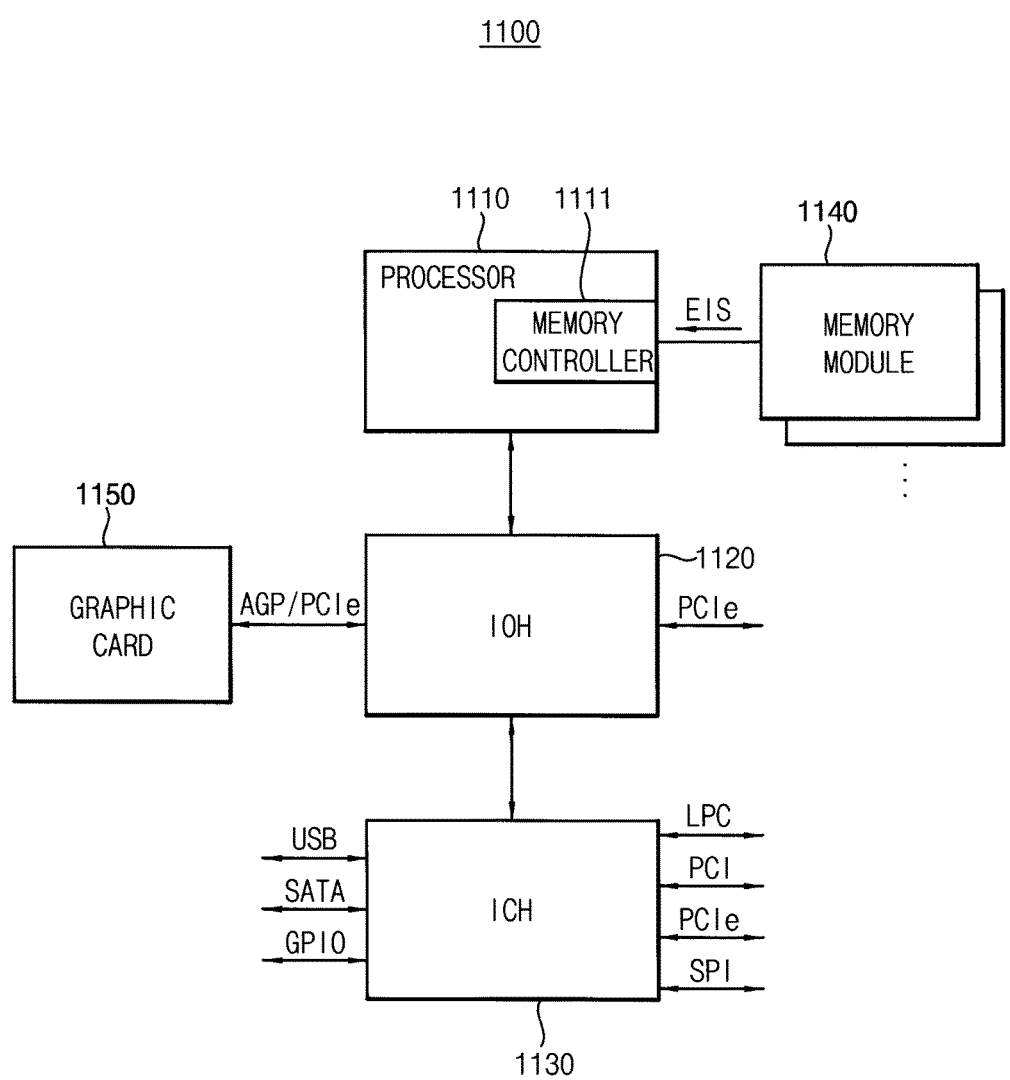
FIG. 24 is a block diagram illustrating a computing system including the semiconductor memory device according to some example embodiments.

FIG. 24 is a block diagram illustrating a computing system including the semiconductor memory device according to some example embodiments.

Referring to FIG. 24, a computing system 1100 may include a processor 1110, an input/output hub (IOH) 1120, an input/output controller hub (ICH) 1130, at least one memory module 1140 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 21 illustrates the computing system 1100 including one processor 1110, in some embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In some embodiments, the memory controller 1111 may be located inside the input/output hub 1120, which may be referred to as a memory controller hub (MCH).

The memory module 1140 may include a plurality of semiconductor memory devices that store data provided from the memory controller 1111. Each of the plurality of semiconductor memory devices may include an ECC circuit that corrects errors in the memory cells and an error decision circuit that determines correctability of the errors in the memory cells in the test mode. Therefore, in each of the semiconductor memory devices, the test device or the memory controller utilizes numbers and positions of the correctable errors as information for error monitoring, quality level and test solution. In addition, the test device or the memory controller sets a size of error repair unit smaller than a size of the codeword to utilize redundancy resource efficiently. Each of the semiconductor memory devices provides the memory controller 1111 with the error kind signal indicating the kind of errors and the fail address associated with the error kind signal as the error information signal EIS and the memory controller 1111 may determine the error repair policy of each of the semiconductor memory devices based on the error information signal EIS.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a QuickPath interconnect (QPI), a common system interface (CSI), etc. Although FIG. 21 illustrates the computing system 1100 including one input/output hub 1120, in some embodiments, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal semiconductor memory device. In some embodiments, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

The present disclosure may be applied to systems using memory controllers and semiconductor memory devices. The present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor memory device comprising:
    a memory cell array;
    an input/output (I/O) gating circuit configured to read test pattern data from the memory cell array to provide test result data in a test mode, and configured to read a codeword from the memory cell array in a normal mode;
    an error decision circuit configured to determine correctability of errors in the test result data according to a first unit of data whose size is equal to or smaller than a size of the codeword, based on the test pattern data and the test result data, and the error decision circuit configured to provide a first error kind signal indicating a first determination result, in the test mode; and an error check and correction (ECC) circuit configured to decode the codeword, the codeword including main data and parity data generated from the main data, the ECC circuit configured to determine correctability of errors in the codeword according to a second unit of data whose size is equal to or smaller than the size of the codeword, and the ECC circuit configured to provide a second error kind signal indicating a second determination result, in the normal mode, and wherein the main data includes a plurality of units of data.

2. The semiconductor memory device of claim 1, wherein the error decision circuit is configured to be enabled in response to a mode signal indicating the test mode.

3. The semiconductor memory device of claim 1, wherein the error decision circuit includes,
- a first buffer configured to store the test pattern data;
- a second buffer configured to store the test result data;
- a comparator circuit configured to compare corresponding bits of the test pattern data and the test result data, and to output comparison result data; and
- an error counter block configured to provide the first error kind signal based on the comparison result data.

4. The semiconductor memory device of claim 3, wherein the comparator circuit includes a plurality of comparators,
- each of the plurality of comparators is configured to compare a corresponding bit of the test pattern data and the test result data and is configured to output a bit of the comparison result data; and the error counter block includes,
- a plurality of error counters, each of the plurality of error counters configured to count a number of errors based on the comparison result data, and
- a logic unit configured to provide the first error kind signal based on output of the plurality of error counters.

5. The semiconductor memory device of claim 3, wherein the error decision circuit is configured to output the first error kind signal with a first logic level when a number of errors in the test result data is zero or within an error correction capability of the ECC circuit.

6. The semiconductor memory device of claim 3, wherein the error decision circuit is configured to output the first error kind signal with a second logic level when a number of errors in the test result data exceeds an error correction capability of the ECC circuit.

7. The semiconductor memory device of claim 1, wherein the ECC circuit includes,
- an encoder configured to receive the main data to generate the parity data and provide the codeword to the I/O gating circuit; and
- a decoder configured to receive the codeword from the I/O gating circuit and detect one or more errors in the main data using the parity data.

8. The semiconductor memory device of claim 7, wherein the decoder includes,
- a syndrome generator configured to generate syndromes based on the main data and the parity data;
- an error position detector configured to detect a position of the one or more errors in the main data based on the syndromes;
- an error corrector configured to correct the one or more errors in the main data based on the position of the one or more errors to provide a corrected main data; and
- an error signal generator configured to generate the second error kind signal based on the position of the one or more errors.

9. The semiconductor memory device of claim 1, further comprising:
- a register unit configured to store the first error kind signal and a first fail address associated with the first error kind signal in the test mode, and
- the register unit configured to store the second error kind signal and a second fail address associated with the second error kind signal in the normal mode.

10. The semiconductor memory device of claim 9, wherein
the register unit includes,
- a register configured to store the first error kind signal and the second error kind signal; and
- a fail address table configured to store the first fail address and the second fail address.

11. A memory system comprising:
a semiconductor memory device; and
a memory controller configured to control the semiconductor memory device, the semiconductor memory device including,
- a memory cell array having a normal cell array and a redundancy cell array;
- an input/output (I/O) gating circuit configured to write a codeword in the memory cell array and configured to read the codeword from the memory cell array;
- an error check and correction (ECC) circuit configured to encode main data, the main data including a plurality of units of data to generate parity data,
  - the ECC circuit configured to provide the codeword, the codeword including the main data and the parity data, to the I/O gating circuit,
  - the ECC circuit configured to decode the codeword,
  - the ECC circuit configured to determine correctability of one or more errors in the codeword by an error unit whose size is equal to or smaller than a size of the codeword, and
  - the ECC circuit configured to provide an error kind signal indicating a determination result, in a normal mode; and
- a register unit configured to store the error kind signal and a fail address associated with the error kind signal and configured to provide the error kind signal and the fail address associated with the one or more errors to the memory controller as an error information signal.

12. The memory system of claim 11, wherein the memory controller is configured to determine an error repair policy that handles the one or more errors in the codeword based on the error information signal.

13. The memory system of claim 12, wherein the memory controller is configured to determine the error repair policy such that the one or more errors are handled by the error unit whose size is equal to or smaller than the size of the codeword, and when the errors are handled by the error unit whose size is equal to or smaller than the size of the codeword, a size of the error unit by which the errors are handled is greater than or equal to a size of the unit of data.

14. The memory system of claim 13, wherein when the error unit by which the one or more errors are handled includes errors exceeding an error correction capability of the ECC circuit, the memory controller is configured to control the semiconductor memory device such that the semiconductor memory device handles the errors exceeding the error correction capability using the redundancy cell array.

15. The memory system of claim 13, wherein when the error unit by which the one or more errors are handled includes errors within an error correction capability of the ECC circuit, the memory controller is configured to control the semiconductor memory device such that the semiconductor memory device handles the errors using the ECC circuit.

16. A system for error checking semiconductor memory comprising:
   an I/O gating circuit configured to write test pattern data into a memory array, and configured to read the test pattern data from the memory array as test result data;
   an error decision circuit configured to determine whether a memory error occurred based on the test result data and the test pattern data, and configured to generate an error type signal based on results of the determining, the error type signal indicating a type of error; and
   a register unit configured to generate an error information signal based on the error type signal.

17. The system of claim 16, wherein the register unit is configured to generate the error information signal based on the error type signal and a memory address associated with the error type signal.

18. The system of claim 16, wherein a test device is configured to receive the error information signal and to determine an error repair policy based on the error information signal.

19. The system of claim 16, further comprising:
   an error check and correction circuit (ECC) configured to
      determine the presence of errors in the data read from the memory array, and
      the ECC circuit is configured to generate a second error type signal based on results of the determining performed by the ECC circuit; and
   wherein the register unit is configured to generate the error information signal based on the second error type signal and a memory address associated with the second error type signal.

20. The system of claim 19, further comprising:
a memory controller configured to receive the error information signal and determine an error repair policy based on the error information signal.

* * * * *